US010997886B2

(12) United States Patent
 Huang

(10) Patent No.: US 10,997,886 B2
(45) Date of Patent: May 4, 2021

(54) SHIFT REGISTER AND METHOD OF DRIVING THE SAME, GATE DRIVING CIRCUIT, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Fei Huang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/343,729

(22) PCT Filed: Aug. 9, 2018

(86) PCT No.: PCT/CN2018/099669
§ 371 (c)(1),
(2) Date: Apr. 19, 2019

(87) PCT Pub. No.: WO2019/085578
PCT Pub. Date: May 9, 2019

(65) Prior Publication Data
US 2021/0020089 A1    Jan. 21, 2021

(30) Foreign Application Priority Data
Oct. 31, 2017 (CN) .......................... 201711048848.1

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G11C 19/287* (2013.01); *G09G 2310/0267* (2013.01); *G09G 2310/0286* (2013.01)

(58) Field of Classification Search
CPC .................................. G09G 3/20; G09G 3/36
(Continued)

(56) References Cited

U.S. PATENT DOCUMENTS 6,556,646 B1     4/2003 Yeo et al.
8,537,094 B2 *   9/2013 Yang ...................... G11C 19/28
                                                              345/100
(Continued)

FOREIGN PATENT DOCUMENTS

CN   104282255 A    1/2015
CN   104505049 A    4/2015
(Continued)

OTHER PUBLICATIONS

International Search Report and Written Opinion issued in corresponding International Application No. PCT/CN2018/099669, dated Oct. 16, 2018, with English translation.
(Continued)

*Primary Examiner* — Hai L Nguyen
(74) *Attorney, Agent, or Firm* — McDermott Will & Emery LLP

(57) ABSTRACT

Some embodiments of the present disclosure provide a shift register and a method of driving the same, a gate driving circuit, and a display device. The shift register includes a first input sub-circuit for outputting a voltage on a first control voltage terminal to a pull-up node under control of a first signal input terminal; n output sub-circuits for outputting signal from output clock signal terminals to signal output terminals in sequence under control of the pull-up
(Continued)

node; a first pull-down control sub-circuit for outputting a voltage on the first control voltage terminal to a pull-down node under control of a first clock signal terminal; a second pull-down control sub-circuit for pulling down a voltage on the pull-down node to a first voltage under control of the pull-up node; and a pull-down sub-circuit for pulling down a voltage on the pull-up node to the first voltage under control of the pull-down node.

18 Claims, 8 Drawing Sheets

(58) Field of Classification Search
 USPC .......................................................... 377/64
 See application file for complete search history.

(56) References Cited

U.S. PATENT DOCUMENTS

| | | | | |
|---|---|---|---|---|
| 8,866,724 | B2* | 10/2014 | Moon | G09G 3/3677 |
| | | | | 345/100 |
| 9,881,572 | B2* | 1/2018 | Huang | G09G 3/3648 |
| 10,613,661 | B2* | 4/2020 | Huang | G06F 3/0412 |
| 10,825,397 | B2* | 11/2020 | Qin | G09G 3/3266 |
| 2016/0247442 | A1 | 8/2016 | Dai et al. | |
| 2017/0018243 | A1 | 1/2017 | Huang et al. | |
| 2017/0330526 | A1 | 11/2017 | Fan et al. | |
| 2018/0226133 | A1 | 8/2018 | Feng et al. | |
| 2019/0006018 | A1 | 1/2019 | Fang et al. | |

FOREIGN PATENT DOCUMENTS

| | | |
|---|---|---|
| CN | 104700803 A | 6/2015 |
| CN | 105096865 A | 11/2015 |
| CN | 105761660 A | 7/2016 |
| CN | 106128364 A | 11/2016 |
| CN | 106601175 A | 4/2017 |
| CN | 107068088 A | 8/2017 |
| CN | 107633833 A | 1/2018 |
| KR | 10-2011-0077108 A | 7/2011 |

OTHER PUBLICATIONS

First Office Action issued in corresponding Chinese Application No. 201711048848.1, dated Sep. 29, 2019, with English translation.

* cited by examiner

SHIFT REGISTER AND METHOD OF DRIVING THE SAME, GATE DRIVING CIRCUIT, AND DISPLAY DEVICE

CROSS-REFERENCE TO RELATED APPLICATION

This application is a national phase entry under 35 USC 371 of International Patent Application No. PCT/CN2018/099669 filed on Aug. 9, 2018, which claims priority to Chinese Patent Application No. 201711048848.1, filed with Chinese Patent Office on Oct. 31, 2017, titled "SHIFT REGISTER UNIT AND METHOD OF DRIVING THE SAME, GATE DRIVING CIRCUIT, AND DISPLAY DEVICE", which are incorporated herein by reference in their entirety.

TECHNICAL FIELD

The present disclosure relates to the field of display technologies, and in particular, to a shift register and a method of driving the same, a gate driving circuit, and a display device.

BACKGROUND

A liquid crystal display (LCD) has advantages of low radiation, small size and low power consumption, and is widely used in electronic products such as laptops, flat-screen televisions, or mobile phones.

SUMMARY

In a first aspect, a shift register is provided, and the shift register includes a first input sub-circuit, a first pull-down control sub-circuit, a second pull-down control sub-circuit, pull-down sub-circuit, and n output sub-circuits. n is greater than or equal to 2, and n is a positive integer. The first input sub-circuit is coupled to a first signal input terminal, a first control voltage terminal and a pull-up node, and the first input sub-circuit is configured to output a voltage on the first control voltage terminal to the pull-up node under control of the first signal input terminal. Each output sub-circuit is coupled to the pull-up node, a signal output terminal and an output clock signal terminal, and the output sub-circuit is configured to output a signal from the output clock signal terminal to the signal output terminal under control of the pull-up node. The first pull-down control sub-circuit is coupled to the first control voltage terminal, a first clock signal terminal and a pull-down node, and the first pull-down control sub-circuit is configured to output a voltage on the first control voltage terminal to the pull-down node under control of the first clock signal terminal. The second pull-down control sub-circuit is coupled to the pull-up node, the pull-down node, and a first voltage terminal, and the second pull-down control sub-circuit is configured to pull down a voltage on the pull-down node to a first voltage under control of the pull-up node. The pull-down sub-circuit is coupled to the pull-up node, the pull-down node and the first voltage terminal, and the pull-down sub-circuit is configured to pull down a voltage on the pull-up node to the first voltage under control of the pull-down node.

In some embodiments of the present disclosure, the first input sub-circuit includes a first transistor, a gate of the first transistor is coupled to the first signal input terminal, a first electrode of the first transistor is coupled to the first control voltage terminal, and a second electrode of the first transistor is coupled to the pull-up node.

In some embodiments of the present disclosure, each output sub-circuit includes an output transistor and a voltage stabilizing capacitor. A gate of the output transistor is coupled to the pull-up node, a first electrode of the output transistor is coupled to the output clock signal terminal, and a second electrode of the output transistor is coupled to the signal output terminal. One end of the voltage stabilizing capacitor is coupled to the pull-up node, and another end of the voltage stabilizing capacitor is coupled to the signal output terminal.

In some embodiments of the present disclosure, the first pull-down control sub-circuit includes a second transistor. A gate of the second transistor is coupled to the first clock signal terminal, a first electrode of the second transistor is coupled to the first control voltage terminal, and a second electrode of the second transistor is coupled to the pull-down node. The second pull-down control sub-circuit includes a third transistor. A gate of the third transistor is coupled to the pull-up node, a first electrode of the third transistor is coupled to the pull-down node, and a second electrode of the third transistor is coupled to the first voltage terminal. The pull-down sub-circuit includes a fourth transistor. A gate of the fourth transistor is coupled to the pull-down node, a first electrode of the fourth transistor is coupled to the pull-up node, and a second electrode of the fourth transistor is coupled to the first voltage terminal.

In some embodiments of the present disclosure, the pull-down sub-circuit is further coupled to the signal output terminal, and the pull-down sub-circuit is further configured to pull down a voltage on the signal output terminal to the first voltage terminal under control of the pull-down node. The pull-down sub-circuit further includes a plurality of output pull-down transistors. A gate of each output pull-down transistor is coupled to the pull-down node, a first electrode of the output pull-down transistor is coupled to a signal output terminal, and a second electrode of the output pull-down transistor is coupled to the first voltage terminal.

In some embodiments of the present disclosure, the shift register further includes a first voltage-regulator and noise-reduction sub-circuit coupled between the first input sub-circuit and the pull-up node, and the first voltage-regulator and noise-reduction sub-circuit is also coupled to the first voltage terminal and/or a second voltage terminal. The first voltage-regulator and noise-reduction sub-circuit is configured to stabilize a voltage on the pull-up node and reduce noise of the voltage on the pull-up node under control of the first voltage terminal and/or the second voltage terminal.

In some embodiments of the present disclosure, the first voltage-regulator and noise-reduction sub-circuit includes a first capacitor and/or a fifth transistor. One end of the first capacitor is coupled to an output terminal of the first input sub-circuit, and another end of the first capacitor is coupled to the first voltage terminal. A gate of the fifth transistor is coupled to the second voltage terminal, a first electrode of the fifth transistor is coupled to the output terminal of the first input sub-circuit, and a second electrode of the fifth transistor is coupled to the pull-up node.

In some embodiments of the present disclosure, the shift register further includes a second voltage-regulator and noise-reduction sub-circuit coupled between the first pull-down control sub-circuit and the pull-down node, and the second voltage-regulator and noise-reduction sub-circuit is also coupled to the first voltage terminal and/or a second voltage terminal. The second voltage-regulator and noise-reduction sub-circuit is configured to stabilize a voltage on the pull-down node and reduce noise of the voltage on the pull-down node under control of the first voltage terminal and/or the second voltage terminal.

In some embodiments of the present disclosure, the second voltage-regulator and noise-reduction sub-circuit includes a second capacitor and/or a sixth transistor. One end of the second capacitor is electrically connected to an output terminal of the first pull-down control sub-circuit, and another end of the second capacitor is coupled to the first voltage terminal. A gate of the sixth transistor is coupled to the second voltage terminal, a first electrode of the sixth transistor is coupled to the output terminal of the first pull-down control sub-circuit, and a second electrode of the sixth transistor is coupled to the pull-down node.

In some embodiments of the present disclosure, the shift register further includes a second input sub-circuit. The second input sub-circuit is coupled to a second signal input terminal, a second control voltage terminal and the pull-up node, and the second input sub-circuit is configured to output a voltage on the second control voltage terminal to the pull-up node under control of the second signal input terminal.

In some embodiments of the present disclosure, the shift register further includes a third pull-down control sub-circuit. The third pull-down control sub-circuit is coupled to a second control voltage terminal, a second clock signal terminal and the pull-down node. The third pull-down control sub-circuit is configured to output a voltage on the second control voltage terminal to the pull-down node under control of the second clock signal terminal.

In some embodiments of the present disclosure, the second input sub-circuit includes an eighth transistor. A gate of the eighth transistor is coupled to the second signal input terminal, a first electrode of the eighth transistor is coupled to the second control voltage terminal, and a second electrode of the eighth transistor is coupled to the pull-up node.

In some embodiments of the present disclosure, the third pull-down control sub-circuit includes a ninth transistor. A gate of the ninth transistor is coupled to the second clock signal terminal, a first electrode of the ninth transistor is coupled to the second control voltage terminal, and a second electrode of the ninth transistor is coupled to the pull-down node.

In a second aspect, a gate driving circuit is provided, and the gate driving circuit includes a plurality of cascaded shift registers according to the first aspect. A first signal input terminal of a first-stage shift register is coupled to an initial signal terminal. Except for the first stage shift register, a first signal input terminal of each stage of the shift registers is coupled to a last signal output terminal of a shift register in a previous stage of the shift register in this stage.

In a third aspect, a gate driving circuit is provided, and the gate driving circuit includes a plurality of cascaded shift registers each of which has a second input sub-circuit. A first signal input terminal of a first-stage shift register is coupled to an initial signal terminal. Except for the first-stage shift register, a first signal input terminal of each stage of the shift registers is coupled to a last signal output terminal of a shift register in a previous stage of the shift register in this stage. Except for a last-stage shift register, a second signal input terminal of each stage of the shift registers is coupled to a first signal output terminal of a shift register in a next stage of the shift register in this stage. A second signal input terminal of the last-stage shift register is coupled to the initial signal terminal.

In a fourth aspect, a display device is provided, including the gate driving circuit according to the second aspect or the third aspect.

In a fifth aspect, a method of driving the shift register described above is provided. Within one image frame, the method includes: in a charging period, outputting, by the first input sub-circuit, a voltage on the first control voltage terminal to the pull-up node under the control of the first signal input terminal, and pulling down, by the second pull-down control sub-circuit, a voltage on the pull-down node to the first voltage terminal under the control of the pull-up node, storing, by each output sub-circuit, a signal at the pull-up node, and outputting, by the output sub-circuit, a signal input via each output clock signal terminal to a signal output terminal coupled to the output sub-circuit under the control of the pull-up node; in an output period, outputting, by each output sub-circuit, a signal stored in the previous period to the pull-up node, and outputting, by output sub-circuits, signals from output clock signal terminals to signal output terminals coupled to the output sub-circuits in sequence under the control of the pull-up node, so that gate scanning signals are output from the signal output terminals in sequence; and in a reset period, outputting, by the first pull-down control sub-circuit, a voltage on the first control voltage terminal to the pull-down node under the control of the first clock signal terminal; pulling down, by the pull-down sub-circuit, a voltage on the pull-up node to the first voltage terminal under the control of the pull-down node.

BRIEF DESCRIPTION OF THE DRAWINGS

In order to describe technical solutions in embodiments of the present disclosure or in the prior art more clearly, the accompanying drawings to be used in the description of embodiments or in the prior art will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

A liquid crystal display includes a color film substrate and an array substrate opposite to each other, and the array substrate may be divided into a display area and a peripheral area disposed around the display area. Gate lines and data lines intersecting vertically and longitudinally with each other are disposed in the above display area, and the gate lines and the data lines intersect to define a plurality of sub-pixels. A data driving circuit is disposed in the peripheral area, and the data driving circuit may achieve the timing sequential latching of the input display data and clock signals, convert the data into analog signals and then input the analog signals to the data lines. In addition, a gate driving circuit is disposed in the peripheral area, and the gate driving circuit may convert the input clock signals into voltages, which control the above sub-pixels to be in an on or off state, via the shift register, and apply the voltages onto the gate lines coupled to the above sub-pixels row by row.

In the related art, the gate driving circuit may use a GOA (Gate Driver on Array) design to integrate a circuit mainly composed of gate switches of TFTs (Thin Film Transistor) in the peripheral area. An output terminal of each stage of shift registers in the GOA circuit is coupled to a gate line. During gate lines are scanned row by row, when a gate line is scanned, the gate line may receive a gate scanning signal output from an output terminal of a shift register coupled to the gate line, while shift registers that are coupled to un-scanned gate lines are in a state in which the shift registers do not output gate scanning signals.

However, each stage of shift registers in the above GOA circuit may output a gate scanning signal to only one gate line. When preparing the GOA circuit in a display panel, the number of shift registers needs to match the number of gate lines, which is not conducive to achieving a narrow bezel of the display panel.

Figure 1:
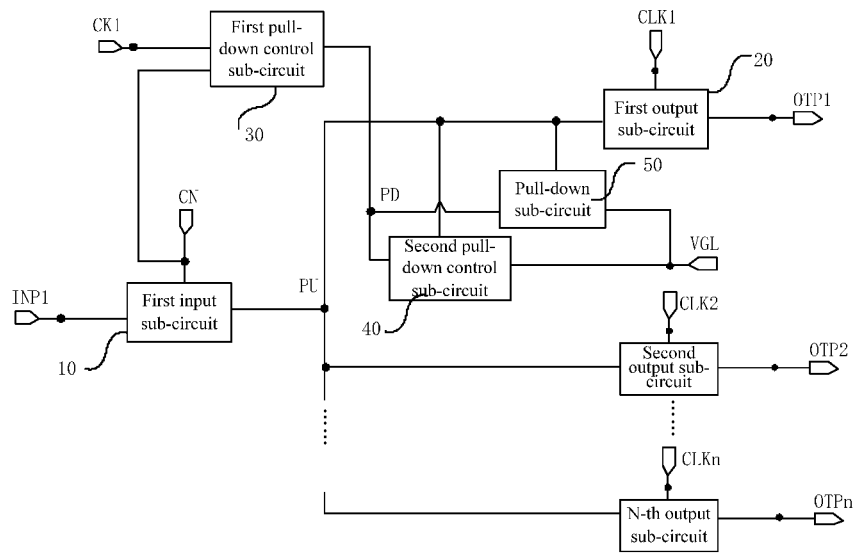
FIG. 1 is a schematic diagram showing a structure of a shift register according to some embodiments of the present disclosure.

To solve the above problem, some embodiments of the present disclosure provide a shift register, and as shown in FIG. 1, the shift register includes a first input sub-circuit 10, a first pull-down control sub-circuit 30, a second pull-down control sub-circuit 40, a pull-down sub-circuit 50, and n output sub-circuits 20 (such as a first output sub-circuit, a second output sub-circuit, . . . , n-th output sub-circuits), wherein n is greater than or equal to 2, and n is a positive integer.

The first input sub-circuit 10 is coupled to a first signal input terminal INPUT1 (hereinafter, INPUT is simply referred to as INP), a first control voltage terminal CN, and a pull-up node PU. The first input sub-circuit 10 is configured to output a voltage on the first control voltage terminal CN to the pull-up node PU under control of the first signal input terminal INP1.

Each output sub-circuit 20 is coupled to the pull-up node PU, a signal output terminal, and an output clock signal terminal. The output sub-circuit is configured to output a signal from the output clock signal terminal CLK to the signal output terminal under control of the pull-up node UP.

In some embodiments of the present disclosure, output clock signal terminals that are coupled to any two of the output sub-circuits 20 respectively may be different and signal output terminals that are coupled to any two of the output sub-circuits 20 respectively may be different. For example, as shown in FIG. 1, the first output sub-circuit is coupled to an output clock signal terminal CLK1 and a signal output terminal OUTPUT1 (hereinafter, OUTPUT is simply referred to as OTP). The second output sub-circuit is coupled to an output clock signal terminal CLK2 and a signal output terminal OTP2. The n-th output sub-circuit is coupled to an output clock signal terminal CLKn and a signal output terminal OTPn.

In addition, the first pull-down control sub-circuit 30 is coupled to the first control voltage terminal CN, a first clock signal terminal CK1, and a pull-down node PD. The first pull-down control sub-circuit 30 is configured to output a voltage on the first control voltage terminal CN to the pull-down node PD under control of the first clock signal terminal CN.

The second pull-down control sub-circuit 40 is coupled to the pull-up node PU, the pull-down node PD, and a first voltage terminal VGL. The second pull-down control sub-circuit 40 is configured to pull down a voltage on the pull-down node PD to a first voltage under control of the pull-up node PU.

The pull-down sub-circuit 50 is coupled to the pull-up node PU, the pull-down node PD and the first voltage terminal VGL, and the pull-down sub-circuit 50 is configured to pull down a voltage on the pull-up node PU to the first voltage under control of the pull-down node PD.

On this basis, some embodiments of the present disclosure provide a shift register, including a first input sub-circuit 10, a first pull-down control sub-circuit 30, a second pull-down control sub-circuit 40, a pull-down sub-circuit 50, and n output sub-circuits 20. The first input sub-circuit 10 is coupled to a first signal input terminal INP1, a first control voltage terminal CN and a pull-up node PU, and the first input sub-circuit 10 is configured to output a voltage on the first control voltage terminal CN to the pull-up node PU under control of the first signal input terminal INP1. Each output sub-circuit 20 is coupled to the pull-up node PU, a signal output terminal, and an output clock signal terminal, and the output sub-circuit is configured to output a signal from the output clock signal terminal CLK to the signal output terminal under control of the pull-up node UP. The first pull-down control sub-circuit 30 is coupled to the first control voltage terminal CN, a first clock signal terminal CK1 and a pull-down node PD, and the first pull-down control sub-circuit 30 is configured to output a voltage on the first control voltage terminal CN to the pull-down node PD under control of the first clock signal terminal CK1. The second pull-down control sub-circuit 40 is coupled to the pull-up node PU, the pull-down node PD, and a first voltage terminal VGL, and the second pull-down control sub-circuit 40 is configured to pull down a voltage on the pull-down node PD to the first voltage terminal VGL under control of the pull-up node PU. The pull-down sub-circuit 50 is coupled to the pull-up node PU, the pull-down node PD and the first voltage terminal VGL, and the pull-down sub-circuit 50 is configured to pull down a voltage on the pull-up node PU to a potential at the first voltage terminal VGL, i.e., the first voltage, under control of the pull-down node PD.

On this basis, within one image frame, a potential at the pull-up node PU may be controlled by the first input sub-circuit 10, and the pull-up node PU may control the output sub-circuits 20 to sequentially output clock signals from the output clock signal terminals such as CLK1, CLK2, . . . , CLKn coupled to respective output sub-circuits 20 to the signal output terminals such as OTP1, OTP2, . . . , OTPn coupled to the respective output sub-circuits, so that in the output period, gate scanning signals may be output from the signal output terminals such as OTP1, OTP2, . . . , OTPn to the gate lines coupled to the respective signal output terminals, such as OTP1, OTP2, . . . , OTPn, respectively.

In addition, the first pull-down control sub-circuit 30 and the second pull-down control sub-circuit 40 can control the potential at the pull-down node PD, to pull down the potential at the pull-down node PD to the potential at the first voltage terminal VGL, or to pull up the potential at the pull-down node PD so that the pull-down node PD can control the pull-down sub-circuit 50 to pull down the potential at the pull-up node PU to the potential at the first voltage terminal VGL.

It can be known from the above that, each stage of the shift registers has a plurality of signal output terminals, such as OTP1, OTP2, . . . , OTPn. Therefore, one stage of the shift registers may be coupled to a plurality of gate lines via different signal output terminals, such that one stage of the shift registers may scan the plurality of gate lines row by row. For achieving the scanning row by row, in a same shift register, when one output clock signal terminal such as CLK1 of the shift register is at a high level, a gate scanning signal is output from a signal output terminal OTP1 coupled to a first output sub-circuit receiving a signal output from the output clock signal terminal CLK1. In this case, clock signals output from other output clock signal terminals such as CLK2, . . . , CLKn are at a low level, and thereby no gate scanning signals are output from the signal output terminal OTP2 coupled to the second output sub-circuit, . . . , and the signal output terminal OTPn coupled to the n-th output sub-circuit, so that the plurality of gate lines coupled to one stage of the shift registers will not receive gate scanning signals simultaneously, thereby achieving the row-by row scanning of the plurality of gate lines. In this way, it is no need for one stage of the shift registers to output the gate scanning signals to only one gate line, and thus the layout area of the shift register occupying the peripheral area in the GOA circuit in the display panel may be reduced, thereby achieving a narrower bezel.

Figure 2:
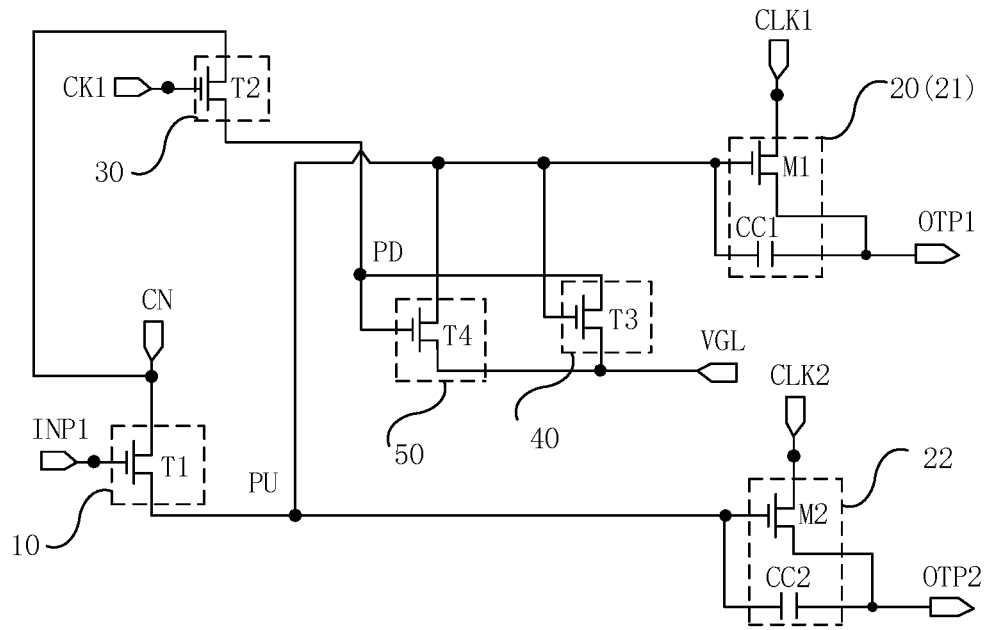
FIG. 2 is a schematic diagram showing specific structures of sub-circuits shown in FIG. 1.

The circuit structure of each sub-circuit in the shift register shown in FIG. 1 is described in detail by taking an example in which one shift register has two output sub-circuits, such as the first output sub-circuit 21 and the second output sub-circuit 22 shown in FIG. 2.

In some embodiments of the present disclosure, as shown in FIG. 2, the first input sub-circuit 10 may include a first transistor T1. A gate of the first transistor T1 is coupled to the first signal input terminal INP1, a first electrode of the first transistor T1 is coupled to the first control voltage terminal CN, and a second electrode of the first transistor T1 is coupled to the pull-up node PU.

Each output sub-circuit 20 includes an output transistor M and a voltage stabilizing capacitor CC. A gate of the output transistor M is coupled to the pull-up node PU, a first electrode of the output transistor M is coupled to the output clock signal terminal, and a second electrode of the output transistor M is coupled to the signal output terminal. One end of the voltage stabilizing capacitor CC is coupled to the pull-up node PU, and another end of the voltage stabilizing capacitor CC is coupled to the signal output terminal.

In the case where one shift register has two output sub-circuits, such as the first output sub-circuit 21 and the second output sub-circuit 22, the first output sub-circuit 21 includes a first output transistor M1 and a first voltage stabilizing capacitor CC1. A gate of the first output transistor M1 is coupled to the pull-up node PU, a first electrode of the first output transistor M1 is coupled to the first output clock signal terminal CLK1, and a second electrode of the first output transistor M1 is coupled to the first signal output terminal OTP1. One end of the first voltage stabilizing capacitor CC1 is coupled to the pull-up node PU, and another end of the voltage stabilizing capacitor CC1 is coupled to the first signal output terminal OTP1.

The second output sub-circuit 22 includes a second output transistor M2 and a second voltage stabilizing capacitor CC2. A gate of the second output transistor M2 is coupled to the pull-up node PU, a first electrode of the second output transistor M2 is coupled to the second output clock signal terminal CLK2, and a second electrode of the second output transistor M2 is coupled to the second signal output terminal OTP2. One end of the second voltage stabilizing capacitor CC2 is coupled to the pull-up node PU, and another end of the second voltage stabilizing capacitor CC2 is coupled to the second signal output terminal OTP2.

As shown in FIG. 2, the first pull-down control sub-circuit 30 includes a second transistor T2. A gate of the second transistor T2 is coupled to the first clock signal terminal CK1, a first electrode of the second transistor T2 is coupled to the first control voltage terminal CN, and a second electrode of the second transistor T2 is coupled to the pull-down node PD.

The second pull-down control sub-circuit 40 includes a third transistor T3. A gate of the third transistor T3 is coupled to the pull-up node PU, a first electrode of the third transistor T3 is coupled to the pull-down node PD, and a second electrode of the third transistor T3 is coupled to the first voltage terminal VGL.

The pull-down sub-circuit 50 includes a fourth transistor T4. A gate of the fourth transistor T4 is coupled to the pull-down node PD, a first electrode of the fourth transistor T4 is coupled to the pull-up node PU, and a second electrode of the fourth transistor T4 is coupled to the first voltage terminal VGL.

It will be noted that, the above transistors may be N-type transistors or P-type transistors, and enhancement-mode transistors or depletion-mode transistors. In addition, first electrodes of the above transistors may be sources, and second electrodes of the above transistors may be drains. Alternatively, the first electrodes of the above transistors may be drains, and the second electrodes of the above transistors may be sources, which will not be limited by the present disclosure.

Hereinafter, the on and off states of each transistor in the shift register shown in FIG. 2 in different periods (P1~P4) of one image frame are described in detail by taking an example in which the above transistors are all N-type transistors with reference to FIG. 3. In some embodiments of the present disclosure, the conditions are described by taking an example in which a direct current (DC) low level is input via the first voltage terminal VGL constantly and a DC high level is input via the first control voltage terminal CN in this image frame. In addition, the following embodiments are described by taking an example in which a high level being output from the signal output terminals such as OTP1, OTP2, . . . , and OTPn indicates that gate scanning signals are output from the above signal output terminals, and a low level being output from the signal output terminals indicates that no gate scanning signals are output from the above signal output terminals.

In the first period P1, INP1=1, CLK1=0, CLK2=0, CK1=0, PU=1, and PD=0, wherein "0" represents a low level, and "1" represents a high level.

In this case, since a high level is input via the first signal input terminal, the first transistor is turned on, and a high level on the first control voltage terminal CN is transmitted to the pull-up node PU through the first transistor. Then the high level on the pull-up node PU are stored in the first voltage stabilizing capacitor CC1 and the second voltage stabilizing capacitor CC2.

The first output transistor M1 and the second output transistor M2 are turned on under control of the pull-up node PU, and a low level on the first output clock signal terminal CLK1 is transmitted to the first signal output terminal OTP1 through the first output transistor M1. In addition, a low level on the second output clock signal terminal CLK2 is transmitted to the second signal output terminal OTP2 through the second output transistor M2. In addition, the third transistor T3 is turned on under control of the pull-up node PU, and the potential at the pull-down node PD is pulled down to the first voltage terminal VGL through the third transistor T3. Therefore, the fourth transistor T4 is in an off state.

In addition, since a low level is input via the first clock signal terminal CK1, the second transistor T2 is in an off state.

In summary, the shift register outputs a low level through both the first signal output terminal OTP1 and the second signal output terminal OTP2 in the first period.

In the second period P2, INP1=0, CLK1=1, CLK2=0, CK1=0, PU=1, and PD=0.

In this case, since a low level is input via the first signal input terminal INP1, the first transistor T1 is in an off state. The first voltage stabilizing capacitor CC1 and the second voltage stabilizing capacitor CC2 charge the pull-up node PU with the high level stored in the first period P1, so that the first output transistor M1 and the second transistor M2 are maintained in the on state in the second period. In this case, the high level on the first output clock signal terminal CLK1 may still be transmitted to the first signal output terminal OTP1 through the first output transistor M1, and the low level on the second output clock signal terminal CLK2 may still be transmitted to the second signal output terminal OTP2 through the second output transistor M2.

In addition, when a high level is output from the first signal output terminal OTP1, the potentials at ends of the first voltage stabilizing capacitor CC1 and the second voltage stabilizing capacitor CC2, which are coupled to the first signal output terminal OTP1 and the second signal output terminal OTP2 respectively, are increased. Therefore, under the bootstrap action of the first voltage stabilizing capacitor CC1 and the second voltage stabilizing capacitor CC2, the potential at ends of the first voltage stabilizing capacitor CC1 and the second voltage stabilizing capacitor CC2, which are coupled to the pull-up node PU, are also increased, thereby further increasing the potential at the pull-up node PU, so that the first output transistor M1 and the second output transistor M2 are remained in the on state in the second period P2 effectively. Therefore, the high level from the first output clock signal terminal CLK1 can be continuously and stably output to the gate line coupled to the first signal output terminal OTP1 as a gate scanning signal.

In addition, similarly to the first period P1, the third transistor T3 is turned on, and the second transistor T2 and the fourth transistor T4 are in the off state.

In conclusion, a high level is input via the first signal output terminal OTP1 in the second period P2, so as to output a gate scanning signal to the gate line coupled to the first signal output terminal OTP1. Except for the first signal output terminal OTP1, a low level is input via other signal output terminals, such as the second signal output terminal OTP2, that is, no gate scanning signals are output from the signal output terminals.

In the third period P3, INP1=0, CLK1=0, CLK2=1, CK1=0, PU=1, and PD=0.

In this case, since a low level is input via the first signal input terminal INP1, the first transistor T1 is in an off state. The first voltage stabilizing capacitor CC1 and the second voltage stabilizing capacitor CC2 charge the pull-up node PU with the high level stored in the first period P1, so that the first output transistor M1 and the second output transistor M2 are still maintained in the on state in the third period P3.

In this case, the low level from the first output clock signal terminal CLK1 is output to the first signal output terminal OTP1 through the first output transistor M1 to reset the first signal output terminal OTP1, so that the gate line coupled to the first signal output terminal OTP1 does not receive the above gate scanning signal anymore. The high level from the second output clock signal terminal CLK2 is output to the second signal output terminal OTP2.

In addition, under the bootstrap action of the first voltage stabilizing capacitor CC1 and the second voltage stabilizing capacitor CC2, the potential at the pull-up node PU is maintained at the high level to maintain the first output transistor M1 and the second output transistor M2 in the on state, so that the high level output from the second output clock signal terminal CLK2 can be output to the gate line coupled to the second signal output terminal OTP2 as a gate scanning signal. In addition, similarly to the first period P1, the third transistor T3 is in an on state, and the second transistor T2 and the fourth transistor T4 are in the off state.

In conclusion, a high level is output from the second signal output terminal OTP2 in the third period P3, so as to output a gate scanning signal to the gate line coupled to the second signal output terminal OTP2. Except for the second signal output terminal OTP2, a low level is output from other signal output terminals, such as the first signal output terminal OTP1, that is, no gate scanning signals are output from these signal output terminals.

In the fourth period P4, INP1=0, CLK1=0, CLK2=0, CK1=1, PU=0, and PD=1.

In this case, since a high level is input via the first clock signal terminal CK1, the second transistor T2 is turned on, and the high level input via the first control voltage terminal CN is transmitted to the pull-down node PD through the second transistor T2.

The fourth transistor T4 is turned on under the control of the pull-down node PD, and the potential at the pull-up node PU is pulled down to the first voltage terminal VGL through the fourth transistor T4, to reset the pull-up node PU. The third transistor T3, the first output transistor M1 and the second output transistor M2 are in the off state under the control of the pull-up node PU, so that no gate scanning signals are output from the first signal output terminal OTP1 and the second signal output terminal OTP2.

Next, the fourth period P4 may be repeated before a next image frame in which the high level is input via the first signal input terminal INP1 again, so as to maintain the potential at the pull-down node PD at a high level, and to pull down the potential at the pull-up node PU under the control of the pull-down node PD to enable the first output transistor M1 and the second output transistor M2 are in an off state.

It will be noted that, the above embodiments are illustrated by taking an example in which one shift register includes two output sub-circuits. When one shift register includes more output sub-circuits, during the operating of the shift register, the working process does not change in the first period P1 and the fourth period P4. The difference of the two situations is that it is necessary to increase the period in which output sub-circuits can output gate scanning signals one by one between the first period P1 and the fourth period P4 according to the number of the output sub-circuits, its specific working principle is the same as that of the second period P2 and the third period P3, which will not be repeated herein.

In addition, the on and off states of the transistors are illustrated by taking an example in which all transistors are N-type transistors. In a case where all transistors are P-type transistors, some of the control signals in FIG. 3 need to be inverted, and the on and off states of the transistors in the sub-circuits of the shift register are the same as those described above, which will not be repeated herein.

Figure 4:
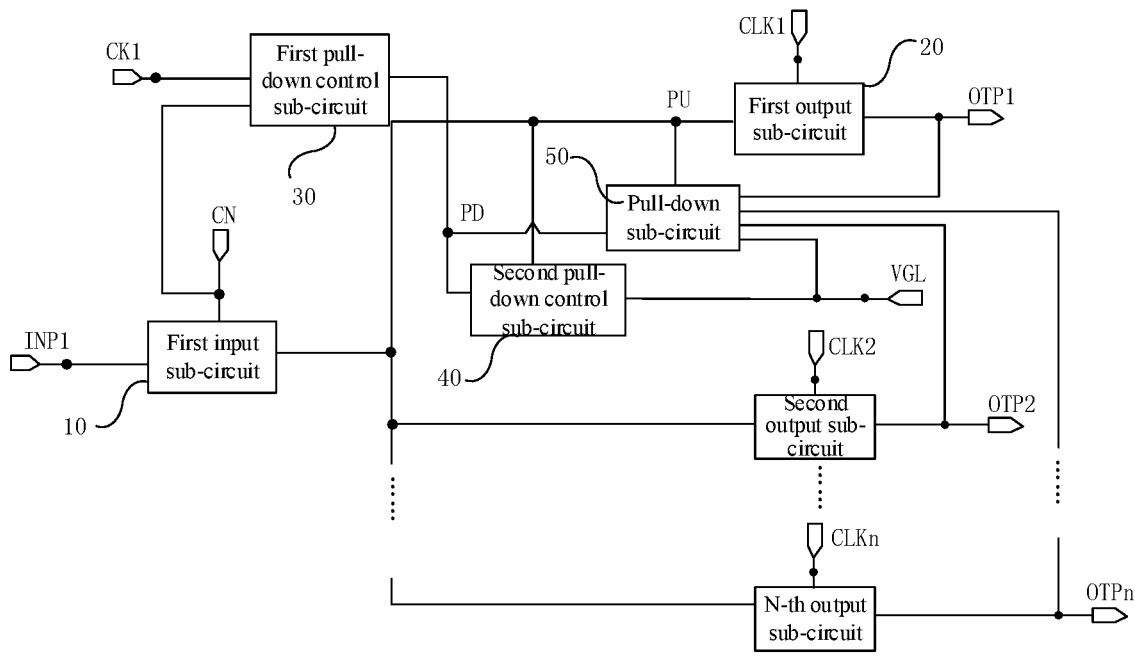
FIG. 4 is a schematic diagram showing a structure of the shift register shown in FIG. 1 in which the pull-down sub-circuit is further coupled to signal output terminals.

On this basis, in some embodiments of the present disclosure, as shown in FIG. 4, the pull-down sub-circuit 50 is further coupled to the signal output terminals, such as OTP2, OTP2, . . . , and OTPn, and the pull-down sub-circuit 50 is further configured to pull down the potentials at the signal output terminals such as OTP2, OTP2, . . . , and OTPn to the first voltage terminal VGL under the control of the pull-down node PD to further reset the signal output terminals, such as OTP2, OTP2, . . . , and OTPn.

In this case, in some embodiments of the present disclosure, the pull-down sub-circuit 50 may further includes output pull-down transistors. A gate of each output pull-down transistor is coupled to the pull-down node PD, a first electrode of the output pull-down transistor is coupled to the signal output terminal, and a second electrode of the output pull-down transistor is coupled to the first voltage terminal VGL.

Figure 5:
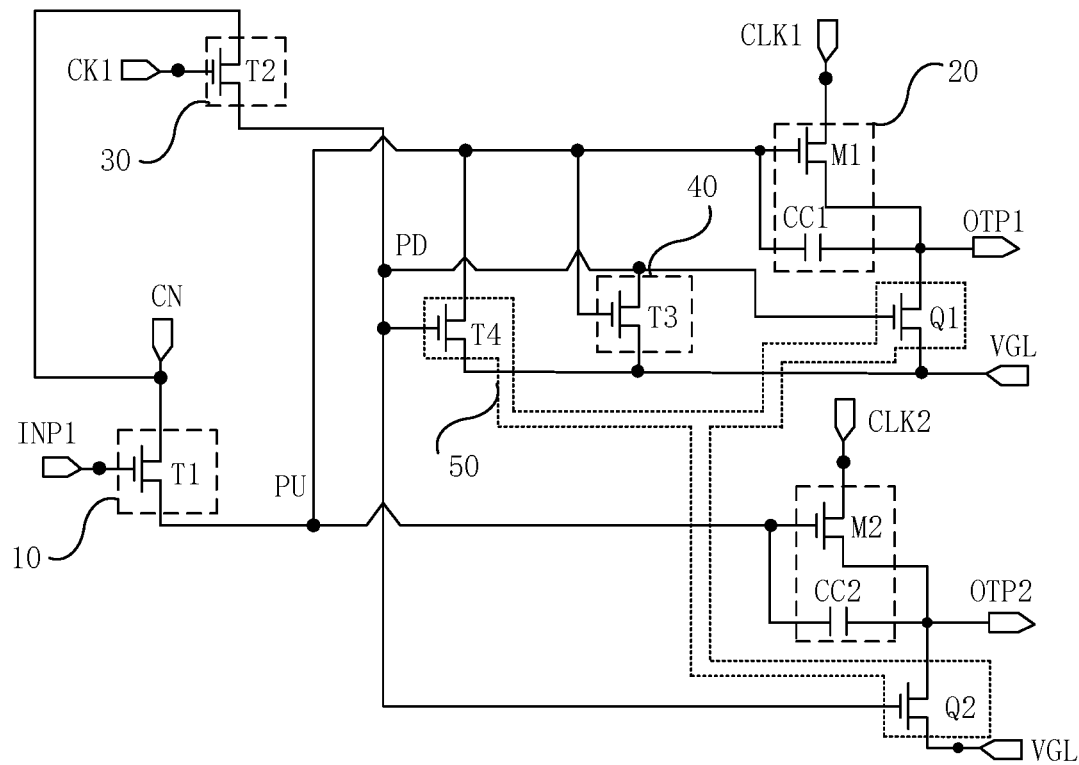
FIG. 5 is a schematic diagram showing specific structures of sub-circuits shown in FIG. 4.

Taking the shift register including two output sub-circuits, i.e., the first output sub-circuit 21 and the second output sub-circuit 22, as an example, as shown in FIG. 5, the pull-down sub-circuit 50 may further include a first output pull-down transistor Q1 and a second output pull-down transistor Q2. A gate of the first output pull-down transistor Q1 is coupled to the pull-down node PD, a first electrode of the first output pull-down transistor Q1 is coupled to the first signal output terminal OTP1, and a second electrode of the first output pull-down transistor Q1 is coupled to the first voltage terminal VGL. A gate of the second output pull-down transistor Q2 is coupled to the pull-down node PD, a first electrode of the second output pull-down transistor Q2 is coupled to the second signal output terminal OTP2, and a second electrode of the second output pull-down transistor Q2 is coupled to the first voltage terminal VGL.

In this case, in the above fourth period, the first output pull-down transistor Q1 and the second output pull-down transistor Q2 are turned on under the control of the pull-down node PD. The potential at the first signal output terminal OTP1 is pulled down to the first voltage terminal VGL through the first output pull-down transistor Q1, and the potential at the second signal output terminal OTP2 is pulled down to the first voltage terminal VGL through the second output pull-down transistor Q2, to reset the first signal output terminal OTP1 and the second signal output terminal OTP2, thereby preventing the first signal output terminal OTP1 and the second signal output terminal OTP2 from outputting abnormally, which improves the operation stability of the shift register.

Figure 13:
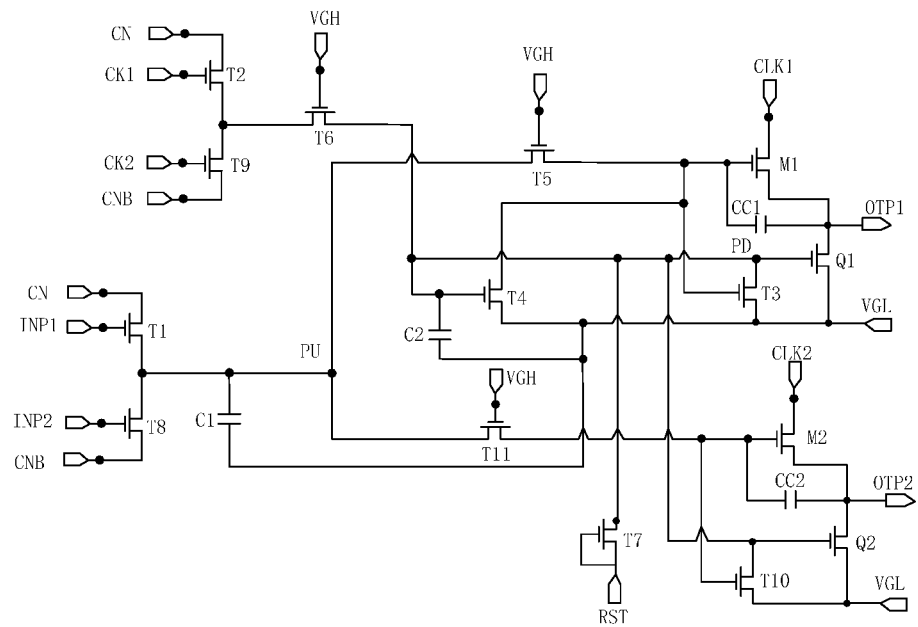
FIG. 13 is a schematic diagram showing a specific structure of another shift register according to some embodiments of the present disclosure.

On this basis, as shown in FIG. 13, the above shift register shown in FIG. 13 further includes a tenth transistor T10 and an eleventh transistor T11.

A gate of the eleventh transistor T11 is coupled to a second voltage terminal VGH, a first electrode of the eleventh transistor T11 is coupled to the pull-up node PU, and a second electrode of the eleventh transistor T11 is coupled to a gate of the tenth transistor T10 and the gate of the second output transistor M2.

A first electrode of the tenth transistor T10 is coupled to the output pull-down transistor coupled to a last signal output terminal of the shift register, such as, the second signal output terminal OTP2 in FIG. 13. For example, the first electrode of the tenth transistor T10 is coupled to the gate of the above second output pull-down transistor Q2. A second electrode of the tenth transistor T10 is coupled to the first voltage terminal VGL.

In this case, taking the tenth transistor T10 and the eleventh transistor T11 being N-type transistors as an example, in the case where a high level is input via the second voltage terminal VGH constantly, the eleventh transistor T11 operated as a single-tube transmission gate is in an on state, so as to utilize the eleventh transistor T11 to further reduce the noise and clutter of the gates of the tenth transistor T10 and the second output transistor M2, and to stabilize the signals at the gates of the tenth transistor T10 and the second output transistor M2. In addition, the tenth transistor T10 is in the on state when the pull-up node PU is at a high level, so as to pull down the potential at the gate of the second output pull-down transistor Q2 to the first voltage terminal VGL. In this case, the second output pull-down transistor Q2 is in an off state, so as to avoid pulling down the signal output from the second signal output terminal OTP2 to the first voltage terminal VGL when gate scanning signals are output from the second signal output terminal OTP2.

Figure 6:
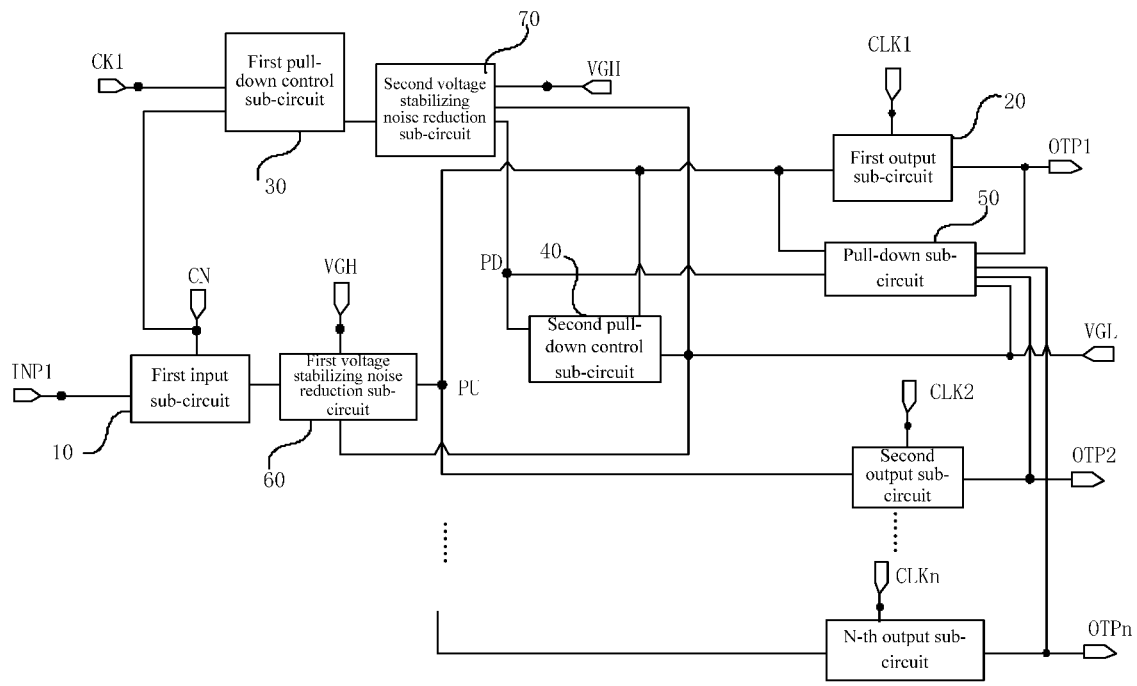
FIG. 6 is a schematic diagram showing a structure of the shift register shown in FIG. 4, in which the shift register further includes a first voltage-regulator and noise-reduction sub-circuit and a second voltage-regulator and noise-reduction sub-circuit.

In some embodiments of the present disclosure, as shown in FIG. 6, the shift register further includes a first voltage-regulator and noise-reduction sub-circuit 60 coupled between the first input sub-circuit 10 and the pull-up node PU, and the first voltage-regulator and noise-reduction sub-circuit 60 may also be coupled to the first voltage terminal VGL and/or the second voltage terminal VGH. The first voltage-regulator and noise-reduction sub-circuit 60 is configured to stabilize the voltage at the pull-up node PU and to reduce the noise and clutter of the pull-up node PU under the control of the above first voltage terminal VGL and/or the second voltage terminal VGH.

Hereinafter, the specific circuit structure of the first voltage-regulator and noise-reduction sub-circuit 60 will be exemplified.

Figure 7:
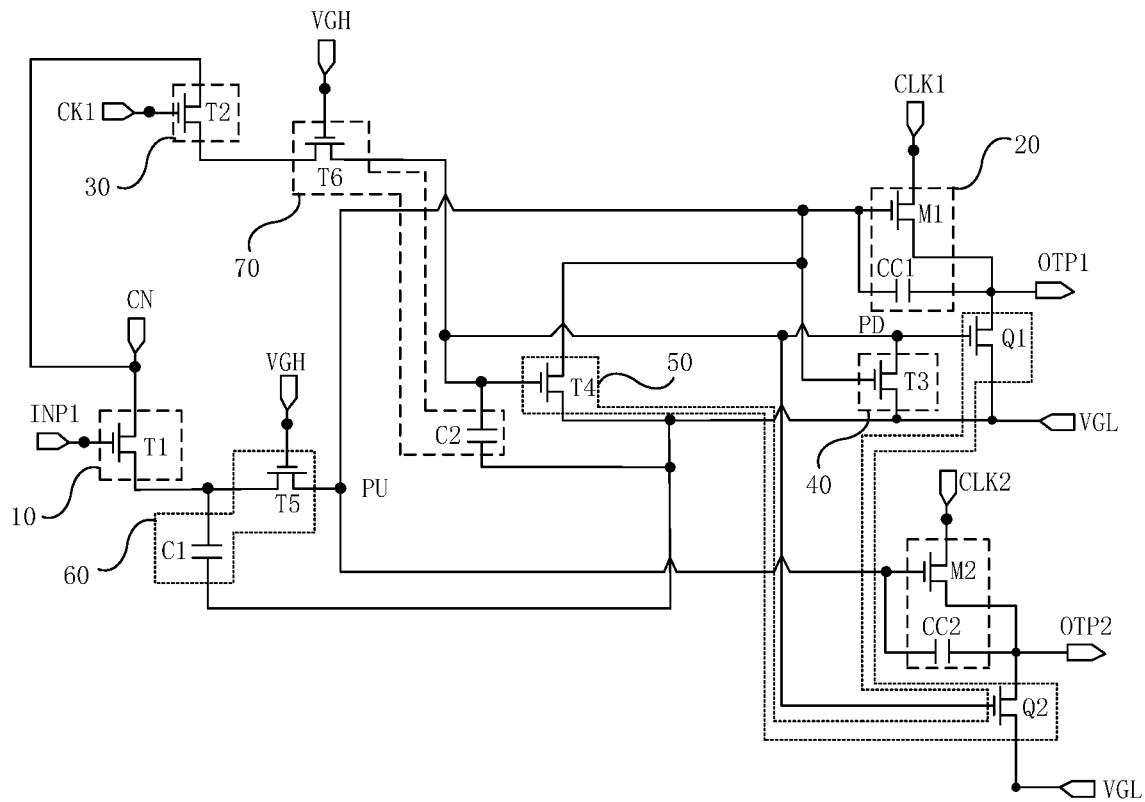
FIG. 7 is a schematic diagram showing specific structures of sub-circuits shown in FIG. 6.

In some embodiments of the present disclosure, as shown in FIG. 7, the first voltage-regulator and noise-reduction sub-circuit 60 may include a first capacitor C1 and a fifth transistor T5. In some other embodiments of the present disclosure, the first voltage-regulator and noise-reduction sub-circuit 60 may only include the above first capacitor C1. In some other embodiments of the present disclosure, the first voltage-regulator and noise-reduction sub-circuit 60 may only include the above fifth transistor T5.

One end of the first capacitor C1 is coupled to an output terminal of the first input sub-circuit 10, and another end of the first capacitor C1 is coupled to the first voltage terminal VGL. A gate of the fifth transistor T5 is coupled to the second voltage terminal VGH, a first electrode of the fifth transistor T5 is coupled to the output terminal of the first input sub-circuit 10, and a second electrode of the fifth transistor T5 is coupled to the pull-up node PU.

It will be noted that, the output terminal of the first input sub-circuit 10 refers to a terminal of the first input sub-circuit 10 for outputting the voltage on the first control voltage terminal CN to the pull-up node PU under the control of the first signal input terminal INP1. The output terminal of the first input sub-circuit 10 in FIG. 7 is the second electrode of the first transistor T1.

In this case, in a case where the first voltage-regulator and noise-reduction sub-circuit 60 includes the first capacitor C1, the first capacitor C1 may filter the noise and clutter of the pull-up node PU under the filtering of the first capacitor C1. In addition, the bootstrap action of the first capacitor C1 may be used to keep the pull-up node PU stable.

In a case where the first voltage-regulator and noise-reduction sub-circuit 60 includes the fifth transistor T5, a DC high level may be input via the second voltage terminal VGH coupled to the gate of the fifth transistor T5 constantly, and thereby the fifth transistor T5 operated as a single-tube transmission gate may always be in the on state under the control of the second voltage terminal VGH. The signal output from the first input sub-circuit 10 is transmitted to the pull-up node PU through the fifth transistor T5 so as to stabilize the voltage on the pull-up node PU. In addition, the fifth transistor T5 may reduce the probability of the transmission of the clutter of the signal output from the first input sub-circuit 10 to the pull-up node PU, so as to reduce the noise and clutter of the pull-up node PU.

In addition, in some embodiments of the present disclosure, as shown in FIG. 6, the shift register further includes a second voltage-regulator and noise-reduction sub-circuit 70 coupled between the first pull-down control sub-circuit 30 and the pull-down node PD, and the second voltage-regulator and noise-reduction sub-circuit 70 may also be coupled to the first voltage terminal VGL and/or the second voltage terminal VGH. The second voltage-regulator and noise-reduction sub-circuit 70 is configured to stabilize the voltage on the pull-down node PD under the control of the first voltage terminal VGL and/or the second voltage terminal VGH, to reduce the noise and clutter of the pull-down node PD.

The specific circuit structure of the second voltage-regulator and noise-reduction sub-circuit 70 will be exemplified below.

In some embodiments of the present disclosure, the second voltage-regulator and noise-reduction sub-circuit 70 may include a second capacitor C2 and a sixth transistor T6 shown in FIG. 7. In some other embodiments of the present disclosure, the second voltage-regulator and noise-reduction sub-circuit 70 may only include the second capacitor C2. In some other embodiments of the present disclosure, the second voltage-regulator and noise-reduction sub-circuit 70 may only include the sixth transistor T6.

In the case where the second voltage-regulator and noise-reduction sub-circuit 70 may only include the second capacitor C2, one end of the second capacitor C2 is directly coupled to an output terminal of the first pull-down control sub-circuit 30, and another end of the second capacitor C2 is coupled to the first voltage terminal VGL. It will be noted that, the output terminal of the first pull-down control sub-circuit 30 refers to a terminal of the first pull-down control sub-circuit 30 for outputting the voltage on the first control voltage terminal CN to the pull-down node PD under the control of the first clock signal terminal CK1. For example, as shown in FIG. 7, the output terminal of the first pull-down control sub-circuit 30 is the second electrode of the second transistor T2.

In this case, in the case where the second voltage-regulator and noise-reduction sub-circuit 70 includes the second capacitor C2, the second capacitor C2 may filter the noise and clutter of the pull-down node PD under the filtering of the second capacitor C2. In addition, the pull-down node PD may be kept stable under the bootstrap action of the second capacitor C2.

In a case where the second voltage-regulator and noise-reduction sub-circuit 70 only includes the sixth transistor T6, a gate of the sixth transistor T6 is coupled to the second voltage terminal VGH, a first electrode of the sixth transistor T6 is coupled to the output terminal of the pull-down control sub-circuit 30, and a second electrode of the sixth transistor T6 is coupled to the pull-down node PD.

In addition, in a case where the second voltage-regulator and noise-reduction sub-circuit 70 includes the second capacitor C2 and the sixth transistor T6, one end of the above second capacitor C2 is coupled to the second electrode of the sixth transistor T6, so that one end of the second capacitor C2 can be coupled to the output terminal of the first pull-down control sub-circuit 30 through the sixth transistor T6.

The sixth transistor T6 operated as a single-tube transmission gate may always be in the on state under the control of the high level from the second voltage terminal VGH constantly. The signal output from the first pull-down control sub-circuit 30 is transmitted to the pull-down node PD through the sixth transistor T6 so as to stabilize the voltage on the pull-down node PD. In addition, the sixth transistor T6 may reduce the probability of the transmission of the clutter of the signal from the first pull-down control sub-circuit 30 to the pull-down node PD, so as to reduce the noise and clutter of the pull-down node PD.

Figure 8:
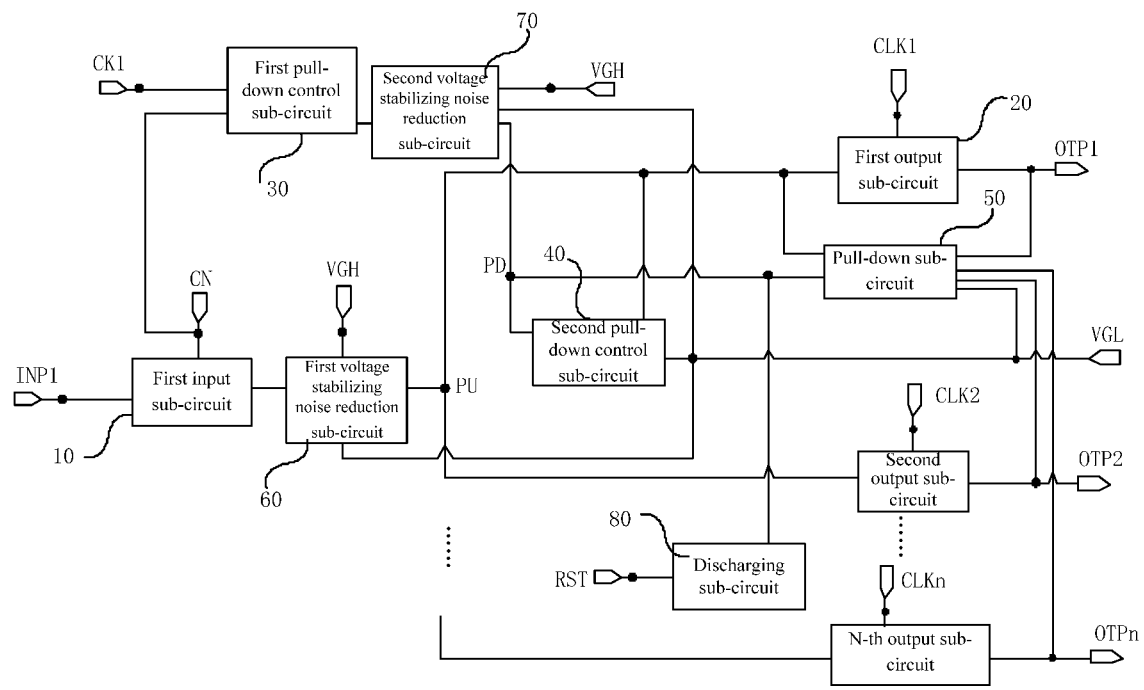
FIG. 8 is a schematic diagram showing a structure of the shift register shown in FIG. 4, in which the shift register further includes a discharge sub-circuit.

In some embodiments of the present disclosure, as shown in FIG. 8, the shift register may further include a discharge sub-circuit 80, and the discharge sub-circuit 80 is coupled to the pull-down node PD and a reset signal terminal RESET (RST for short). The discharge sub-circuit 80 is configured to output a voltage on the reset signal terminal RST to the pull-down node PD under control of the reset signal terminal RST.

The specific circuit structure of the discharge sub-circuit 80 will be exemplified below.

Figure 9:
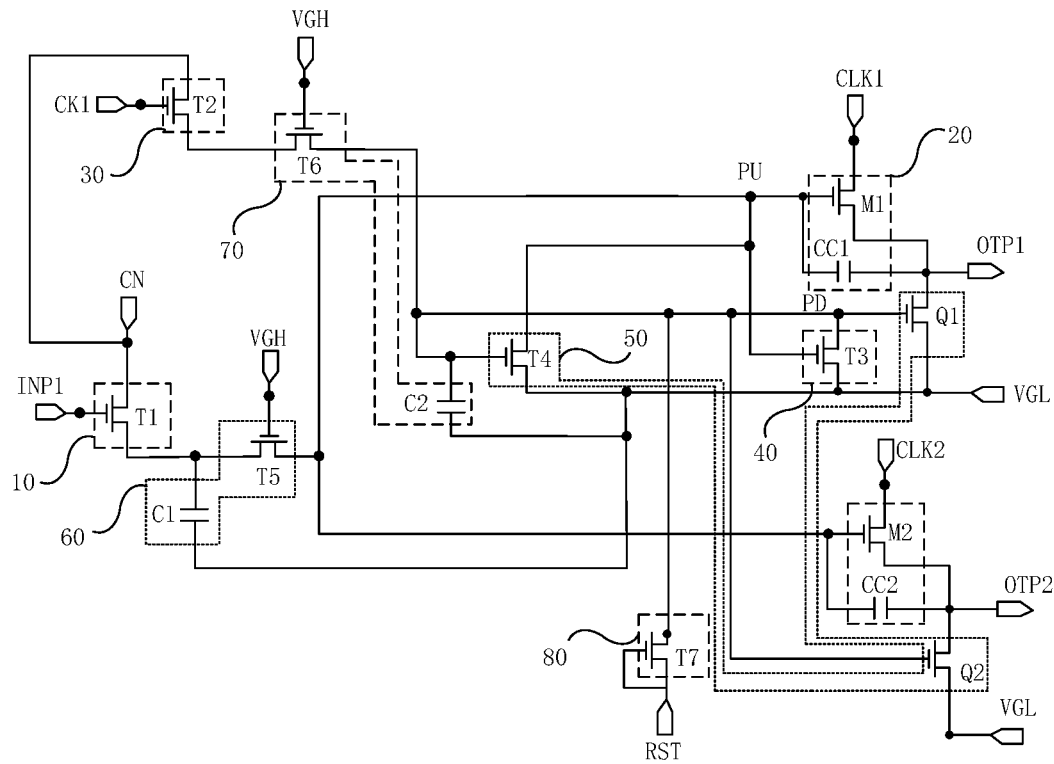
FIG. 9 is a schematic diagram showing specific structures of sub-circuits shown in FIG. 7.

In some embodiments of the present disclosure, as shown in FIG. 9, the discharge sub-circuit 80 includes a seventh transistor T7, a gate and a first electrode of the seventh transistor T7 are coupled to the reset signal terminal RST, and a second electrode of the seventh transistor T7 is coupled to the pull-down node PD.

On this basis, before scanning the next image frame, a high level is input via the reset signal terminal RST, and the seventh transistor T7 is turned on under the control of the reset signal terminal RST. The high level from the reset signal terminal RST is transmitted to the pull-down node PD through the seventh transistor T7, so as to pull up the potential at the pull-down node PD.

The first output pull-down transistor Q1 and the second output pull-down transistor Q2 are turned on under the control of the pull-down node PD, and the potentials at the first signal output terminal OTP1 and the second signal output terminal OTP2 are pulled down by the first output pull-down transistor Q1 and the second output pull-down transistor Q2 to the first voltage terminal VGL. In this way, the signal from each signal output terminal of the shift register can be reset before scanning the next image frame, to avoid crosstalk between the signals of the adjacent image frame.

Figure 10:
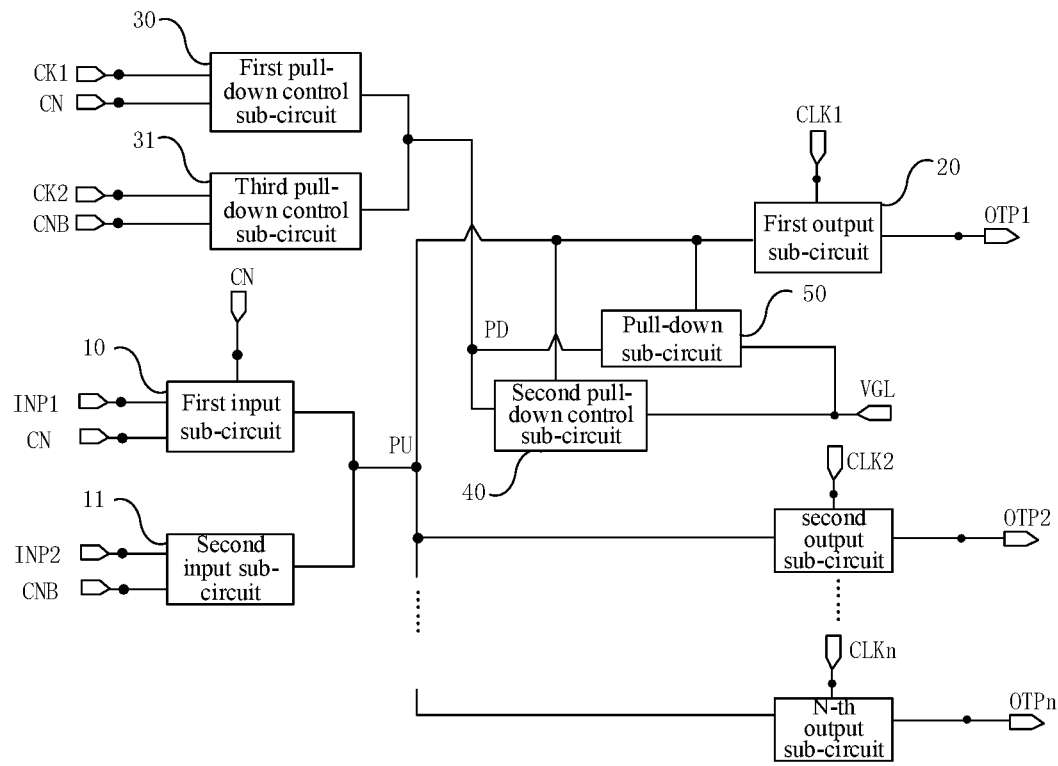
FIG. 10 is a schematic diagram showing a structure of the shift register shown in FIG. 1, in which the shift register further includes a first input sub-circuit and a third pull-down control sub-circuit.

In addition, in some embodiments of the present disclosure, as shown in FIG. 10, the shift register may further include a second input sub-circuit 11 and a third pull-down control sub-circuit 31.

The second input sub-circuit 11 is coupled to a second signal input terminal INP2, a second control voltage terminal CNB, and the pull-up node PU. The second input sub-circuit 11 is configured to output a voltage on the second control voltage terminal CNB to the pull-up node PU under the control of the second signal input terminal INP2.

The third pull-down control sub-circuit 31 is coupled to the second control voltage terminal CNB, a second clock signal terminal CK2 and the pull-down node PD. The third pull-down control sub-circuit 31 is configured to output the voltage on the second control voltage terminal CNB to the pull-down node PD under the control of the second clock signal terminal CK2.

The specific circuit structure of the second input sub-circuit 11 and the third pull-down control sub-circuit 31 will be exemplified below.

Figure 11:
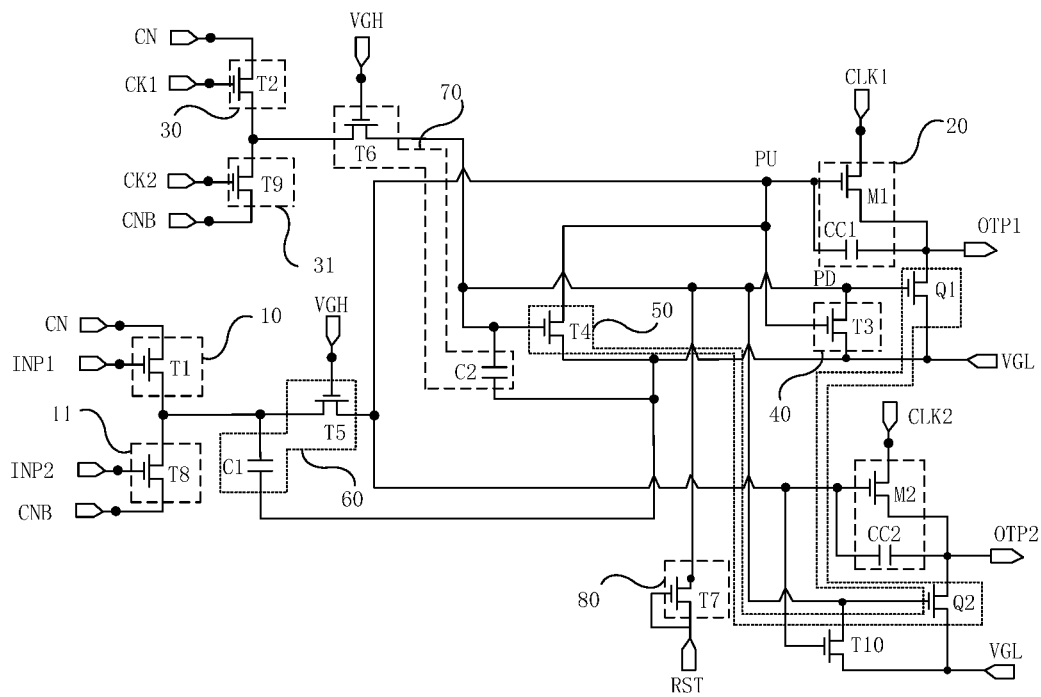
FIG. 11 is a schematic diagram showing a specific structure of a shift register according to some embodiments of the present disclosure.

For example, as shown in FIG. 11, the second input sub-circuit 11 includes an eighth transistor T8. A gate of the eighth transistor T8 is coupled to the second signal input terminal INP2, a first electrode of the eighth transistor T8 is coupled to the second control voltage terminal CNB, and a second electrode of the eighth transistor T8 is coupled to the pull-up node PU.

The third pull-down control sub-circuit 31 includes a ninth transistor T9. A gate of the ninth transistor T9 is coupled to the second clock signal terminal CK2, a first electrode of the ninth transistor T9 is coupled to the second control voltage terminal CNB, and a second electrode of the ninth transistor T9 is coupled to the pull-down node PD.

It will be noted that, the first control voltage terminal CN and the second control voltage terminal CNB in FIG. 11 may be used as control signal terminals for the forward-reverse sweep. When CN=1 and CNB=0, the GOA circuit including a plurality of shift registers described above may perform the forward scanning (from top to bottom) of the plurality of the gate lines coupled to the GOA circuit row by row.

In a case where CN=0 and CNB=1, the GOA circuit including the plurality of shift registers may perform the reverse scanning (from bottom to top) of the plurality of the gate lines coupled to the GOA circuit row by row.

In the GOA circuit including the plurality of shift registers, a first signal input terminal INP1 of a first-stage shift register is coupled to a last signal output terminal OTP of a shift register in the previous stage, and a second signal input terminal INP2 of the first-stage shift register is coupled to a first signal output terminal OTP1 of a shift register in the next stage.

Figure 12:
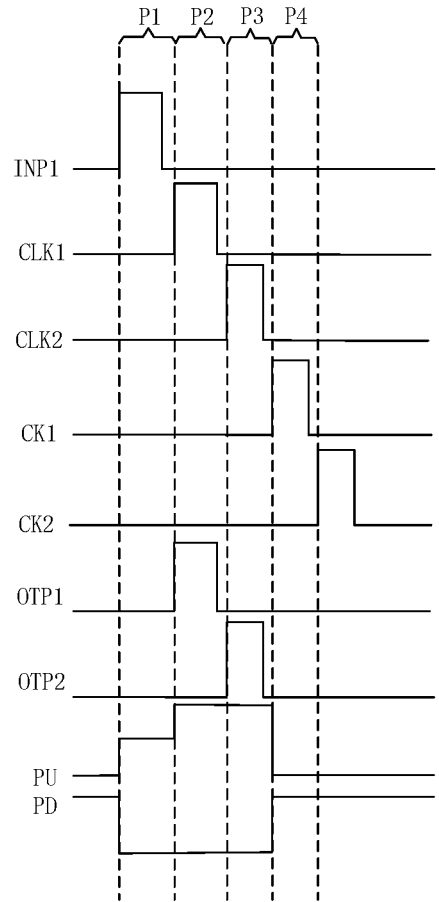
FIG. 12 is a timing diagram of signals for controlling a forward output of the shift register shown in FIG. 11.

The working process of the shift register shown in FIG. 11 in one image frame will be illustrated by taking an example in which the shift register performs a forward scanning with reference to the timing circuit shown in FIG. 12.

When the forward scanning is performed, CN is at a high level, and CNB is at a low level. A high level is input via the first signal input terminal INP1, and a low level is input via the second signal input terminal INP2. The fifth transistor T5 and the sixth transistor T6 are always in the on state under the control of the second voltage terminal VGH.

In the first period P1, INP1=1, CLK1=0, CLK2=0, CK1=0, CK2=0, PU=1, and PD=0.

In this case, since a high level is input via the first signal input terminal INP1, the first transistor T1 is turned on, and then outputs the high level from the first control voltage terminal CN to the pull-up node PU through the fifth transistor T5. The first voltage stabilizing capacitor CC1 and the second voltage stabilizing capacitor CC2 store the high level. The fifth transistor T5 may reduce the probability of the transmission of the clutter of the signal from the first transistor T1 to the pull-up node PU, so as to reduce the noise and clutter of the pull-up node PU. The first capacitor C1 may filter the noise and clutter of the pull-up node PU under the filtering of the first capacitor C1, and the pull-up node PU may be kept stable under the bootstrap action of the first capacitor C1.

The first output transistor M1 and the second output transistor M2 are turned on under the control of the pull-up node PU, and the low level from the first output clock signal terminal CLK1 is transmitted to the first signal output terminal OTP1 through the first output transistor M1. The low level from the second output clock signal terminal CLK2 is transmitted to the second signal output terminal OTP2 through the second output transistor M2.

In addition, the third transistor T3 and the tenth transistor T10 are turned on under the control of the pull-up node PU, and the potential at the pull-down node PD is pulled down to the first voltage terminal VGL through the third transistor T3 and the tenth transistor T10.

In addition, since a low level is input via the second signal input terminal INP2, the eighth transistor T8 is in an off state. Since a low level is input via the first clock signal terminal CK1, the second transistor T2 is in an off state. Since a low level is input via the second clock signal terminal CK2, the ninth transistor T9 is in an off state. Since the potential at the pull-down node PD is at a low level, the fourth transistor T4, the first output pull-down transistor Q1 and the second output pull-down transistor Q2 are in an off state. Since a low level is input via the reset signal terminal RST, the seventh transistor T7 is in an off state.

In conclusion, a low level is output from the signal output terminals such as the first signal output terminal OTP1 and the second signal output terminal OTP2 in the above first period P1.

In the second period P2, INP1=0, CLK1=1, CLK2=0, CK1=0, CK2=0, PU=1, and PD=0.

In this case, since a low level is input via the first signal input terminal INP1, the first transistor T1 is in an off state. The first voltage stabilizing capacitor CC1 and the second voltage stabilizing capacitor CC2 charge the pull-up node PU with the high level stored in the first period P1, so that the first output transistor M1 and the second output transistor M2 are remained in the on state. In this case, the high level from the first output clock signal terminal CLK1 may be transmitted to the first signal output terminal OTP1 through the first output transistor M1, and the low level from the second output clock signal terminal CLK2 may be transmitted to the second signal output terminal OTP2 through the second output transistor M2.

In addition, the potential at the pull-up node PU is further increased under the bootstrap action of the first voltage stabilizing capacitor CC1 and the second voltage stabilizing capacitor CC2, to keep the first output transistor M1 and the second output transistor M2 in the on state, so that the high level from the first output clock signal terminal CLK1 can be output to the gate line coupled to the first signal output terminal OTP1 as a gate scanning signal. In addition, similarly to the first period P1, the third transistor T3 is in the on state, and the second transistor T2, the fourth transistor T4, the eighth transistor T8, the ninth transistor T9, the first output pull-down transistor Q1, the second output pull-down transistor Q2 and the seventh transistor T7 are in the off state.

In conclusion, a high level is output from the first signal output terminal OTP1 in the second period P2, so as to output the gate scanning signal to the gate line coupled to the first signal output terminal OTP1. Except for the first signal output terminal OTP1, a low level is output from other signal output terminals such as the second signal output terminal OTP2, that is, no gate scanning signals are output from these output terminals.

In the third period P3, INP1=0, CLK1=0, CLK2=1, CK1=0, CK2=0, PU=1, and PD=0.

In this case, since a low level is input via the first signal input terminal INP1, the first transistor T1 is in an off state. The first voltage stabilizing capacitor CC1 and the second voltage stabilizing capacitor CC2 charge the pull-up node PU with the high level stored in the first period P1, so that the first output transistor M1 and the second output transistor M2 are maintained in the on state. In this case, the low level from the first output clock signal terminal CLK1 may be transmitted to the first signal output terminal OTP1 through the first output transistor M1, and the high level from the second output clock signal terminal CLK2 may be transmitted to the second signal output terminal OTP2 through the second output transistor M2.

In addition, the potential at the pull-up node PU is maintained at a high level under the bootstrap action of the first voltage stabilizing capacitor CC1 and the second voltage stabilizing capacitor CC2, to keep the first output transistor M1 and the second output transistor M2 in the on state, so that the high level from the second output clock signal terminal CLK2 may be output to the gate line coupled to the second signal output terminal OTP2 as a gate scanning signal.

In addition, similarly to the first period P1, the third transistor T3 is in the on state, and the second transistor T2, the fourth transistor T4, the seventh transistor T7, the eighth transistor T8, the ninth transistor T9, the first output pull-down transistor Q1 and the second output pull-down transistor Q2 are in the off state.

In conclusion, a high level is output from the second signal output terminal OTP2 in the third period P3, so as to output a gate scanning signal to the gate line coupled to the second signal output terminal OTP2. Except for the second signal output terminal OTP2, a low level is output from other signal output terminals, such as the first signal output terminal OTP1.

On this basis, in the third period P3, as shown in FIG. 12, when CLK1=0, the low level from the first output clock signal terminal CLK1 is transmitted to the first signal output terminal OTP1 to reset the first signal output terminal OTP1.

In the fourth period P4, INP1=0, CLK1=0, CLK2=0, CK1=1, CK2=1, PU=0, and PD=1.

In this case, since a high level is input via the first clock signal terminal CK1, the second transistor T2 is turned on, and then transmits the high level from the first control voltage terminal CN to the sixth transistor T6. The high level is transmitted to the pull-down node PD through the sixth transistor T6. The sixth transistor T6 may stabilize the voltage at the pull-down node PD, and the sixth transistor T6 may further reduce the probability of the transmission of the clutter of the signal from the second transistor T2 to the pull-down node PD so as to reduce the noise and clutter of the pull-down node PD. The second capacitor C2 may filter the noise and clutter of the pull-down node PD under the filtering of the second capacitor C2, and the pull-down node PD may be kept stable under the bootstrap action of the second capacitor C2.

The fourth transistor T4 is turned on under the control of the pull-down node PD, and the potential at the pull-up node PU is pulled down to the first voltage terminal VGL through the fourth transistor T4, to reset the pull-up node PU.

In addition, the first output pull-down transistor Q1 and the second output pull-down transistor Q2 are turned on under the control of the pull-down node PD. The potential at the first signal output terminal OTP1 is pulled down to the first voltage terminal VGL through the first output pull-down transistor Q1, the potential at the second signal output terminal OTP2 is pulled down to the first voltage terminal VGL through the second output pull-down transistor Q2, to reset the first signal output terminal OTP1 and the second signal output terminal OTP2. The third transistor T3, the first output transistor M1 and the second output transistor M2 are in the off state under the control of the pull-up node PU.

Next, the fourth period P4 is repeated before a next image frame, so as to keep the potential at the pull-down node PD at a high level. The potential at the pull-up node PU is pulled down under the control of the pull-down node PD to enable the first output transistor M1 and the second output transistor M2 are in the off state.

On this basis, a high level is input via the reset signal terminal RST before scanning the next image frame, and the seventh transistor T7 is turned on. The high level from the reset signal terminal RST is transmitted to the pull-down node PD through the seventh transistor T7, and the pull-up node PU, the first signal output terminal OTP1 and the second signal output terminal OTP2 are reset under the control of the pull-down node PD, to avoid the crosstalk between signals in the adjacent image frames.

It will be noted that, when the shift register performs a reverse scanning, a low level is input via the first control voltage terminal CN, and a high level is input via the second control voltage terminal CNB. In the first period P1, the voltage on the second control voltage terminal CNB is output to the pull-up node PU under the control of the second signal input terminal INP2. In the fourth period, a high level is input via the second clock signal terminal CK2, and the voltage on the second control voltage terminal CNB is output to the pull-down node PD under the control of the second clock signal terminal CK2. The working principles of the second period P2 and the third period P3 are the same as that of the forward outputting, which will not be repeated herein.

Figure 15:
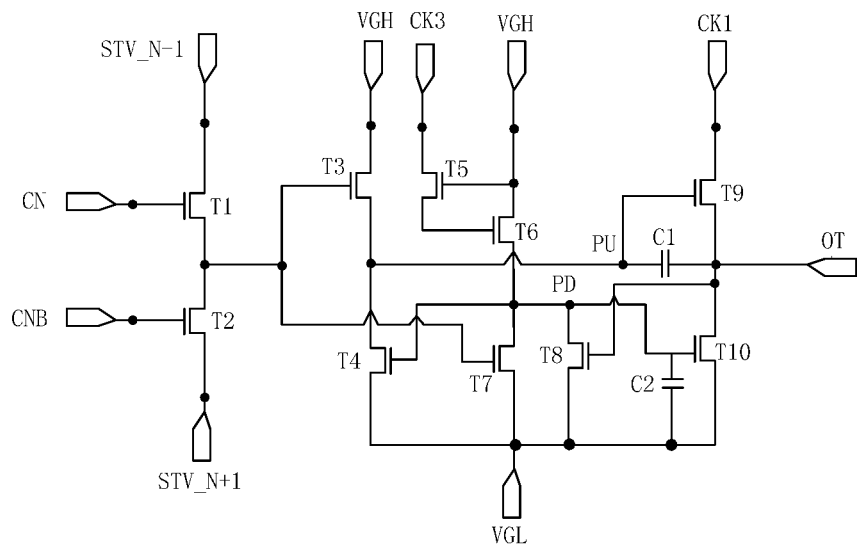
FIG. 15 is a schematic diagram showing a specific structure of a shift register in the related art.

In addition, the shift register in the related art shown in FIG. 15 includes 10 transistors and 2 capacitors. Taking gate scanning signals being output to two gate lines as an example, two cascaded shift registers, i.e., 20 transistors and 2 capacitors, are needed. However, one shift register provided by some embodiments of the present disclosure may output gate scanning signals to at least two gate lines successively, and may use fewer transistors compared with the existing shift register, so as to reduce the power consumption of the shift register.

Figure 14A:
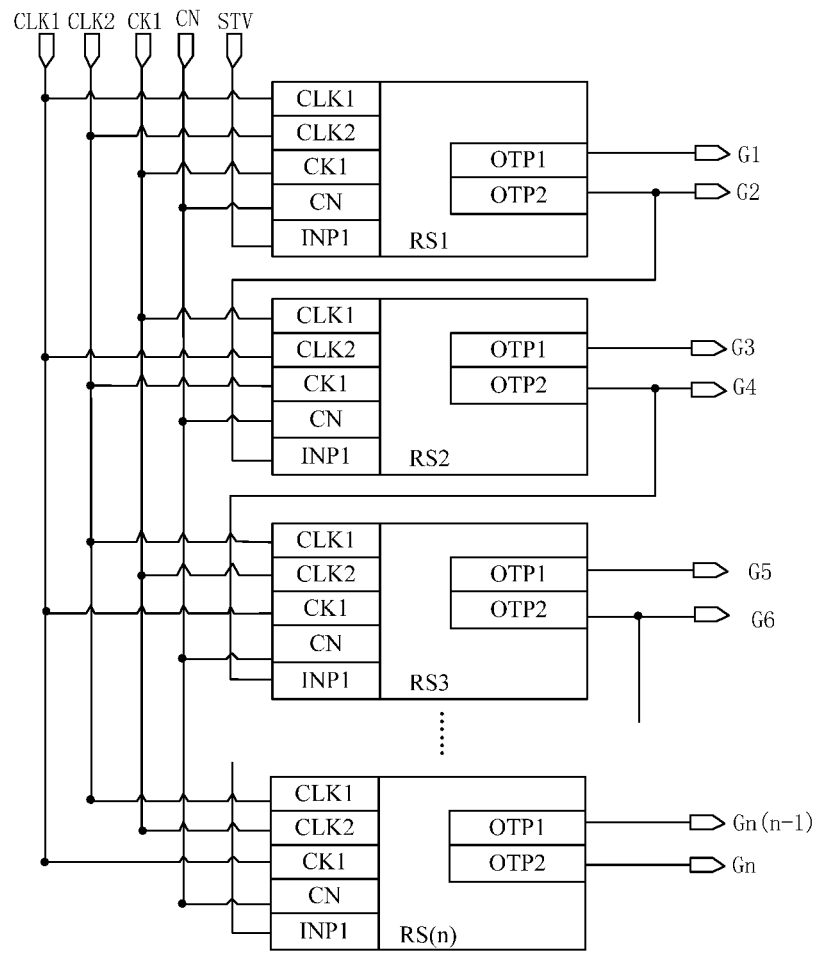
FIG. 14a is a schematic diagram showing a structure of a gate driving circuit according to some embodiments of the present disclosure.

Some embodiments of the present disclosure provide a gate driving circuit shown in FIG. 14*a*, and the gate driving circuit includes a plurality of cascaded shift registers, which are chosen from any one kind of shift registers shown in FIGS. 1-9. A first signal input terminal INP1 of a first-stage shift register RS1 is coupled to an initial signal terminal STV.

Except for the first-stage shift register RS1, a first signal input terminal INP1 of each stage of the shift registers is coupled to a last signal output terminal of a shift register in a previous stage of the shift register in this stage.

The initial signal terminal STV is configured to input an initial signal, and the first-stage shift register RS1 of the gate driving circuit scans gate lines (G1, G2, . . . , Gn) row by row after receiving the above initial signal.

It will be noted that, FIG. 14*a* is an illustration by taking an example in which each stage of the shift registers includes two signal output terminals OTP. The first signal input terminal INP1 of the first-stage shift register RS1 is coupled to the initial signal terminal STV.

Except for the first-stage shift register RS1, a first signal input terminal INP1 of each stage of the shift registers is coupled to a last signal output terminal OTP2 of a shift register in a previous stage of the shift register in this stage.

On this basis, some embodiments of the present disclosure provide a gate driving circuit, including a plurality of cascaded shift registers shown in any one of FIGS. 1-9, and the gate driving circuit has a same structure and beneficial effects as any one of the shift registers shown in FIGS. 1-9. Since the structure and beneficial effects of the above shift register have been illustrated, they will not be repeated herein.

Figure 14B:
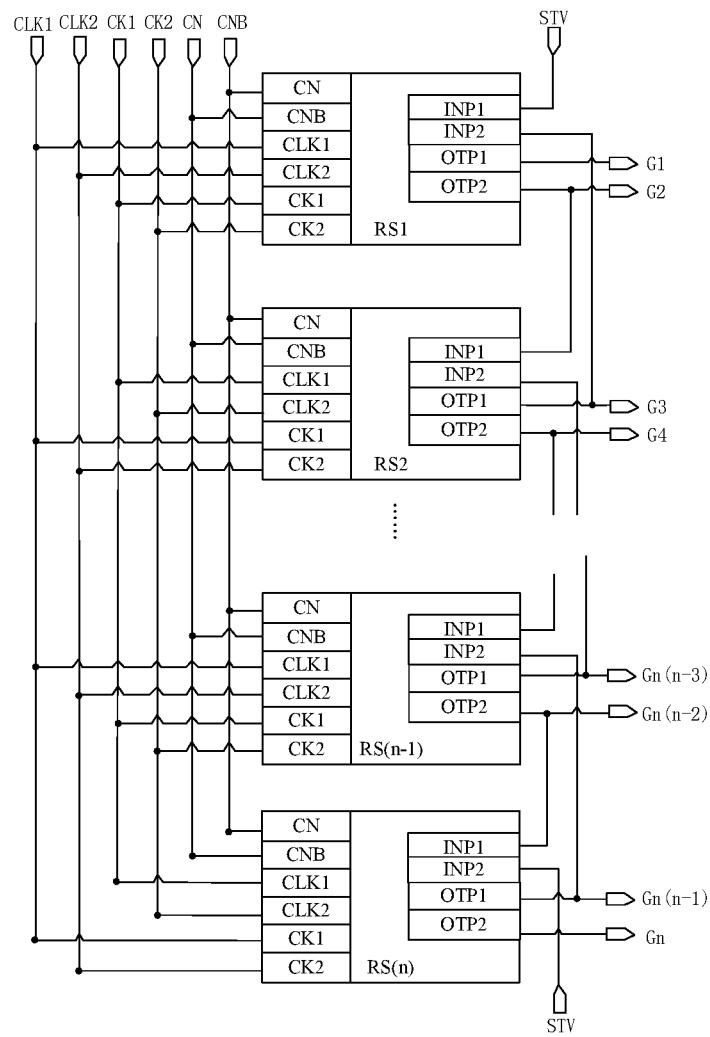
FIG. 14b is a schematic diagram showing a structure of another gate driving circuit according to some embodiments of the present disclosure.

Some embodiments of the present disclosure further provide a gate driving circuit, as shown in FIG. 14*b*, including a plurality of cascaded shift registers shown in FIG. 10 or 11.

A first signal input terminal INP1 of a first-stage shift register RS1 is coupled to an initial signal terminal STV.

Except for the first-stage shift register RS1, a first signal input terminal INP1 of each stage of the shift registers is coupled to a last signal output terminal of a shift register in a previous stage of the shift register in this stage.

Except for the last-stage shift register RSn, a second signal input terminal INP2 of each stage of the shift registers is coupled to a first signal output terminal OTP1 of a shift register in a next stage of the shift register in this stage.

The second signal input terminal INP2 of the last-stage shift register RSn is coupled to the initial signal terminal STV.

The initial signal terminal STV is configured to input an initial signal, the first-stage shift register RS1 of the gate driving circuit forward scans the gate lines (G1, G2, . . . , Gn) row by row after receiving the above initial signal. Alternatively, the last-stage shift register RSn of the gate driving circuit reverse scans the gate lines (G1, G2, . . . , Gn) row by row after receiving the above initial signal.

It will be noded that, FIG. 14*b* is an illustration taking an example in which each stage of the shift registers includes two signal output terminals OTP. The first signal input terminal INP1 of the first-stage shift register RS1 is coupled to an initial signal terminal STV.

Except for the first-stage shift register RS1, a first signal input terminal INP1 of each stage of the shift registers is coupled to the second signal output terminal OTP2 of the shift register in a previous stage of the shift register in this stage.

Except for the last-stage shift register RSn, a second signal input terminal INP2 of each stage of the shift registers is coupled to a first signal output terminal OTP1 of a shift register in a next stage of the shift register in this stage.

The second signal input terminal INP2 of the last-stage shift register RSn is coupled to the initial signal terminal STV.

On this basis, some embodiments of the present disclosure provide a gate driving circuit, including any shift register shown FIG. 10 or 11, and the gate driving circuit has same structures and beneficial effects as the shift register shown in FIG. 10 or 11. Since the structures and beneficial effects of the above shift register have been illustrated, they will not be repeated herein.

Some embodiments of the present disclosure provide a display device including any one of the above gate driving circuits, and the display device has same structures and beneficial effects as the gate driving circuit provided by the embodiments mentioned above. Since the structures and beneficial effects of the gate driving circuit have been described in detail in the embodiments mentioned above, which will not be repeated herein.

Some embodiments of the present disclosure further provide a method of driving any one of the above shift registers, and in one image frame, the method includes the following steps.

Figure 3:
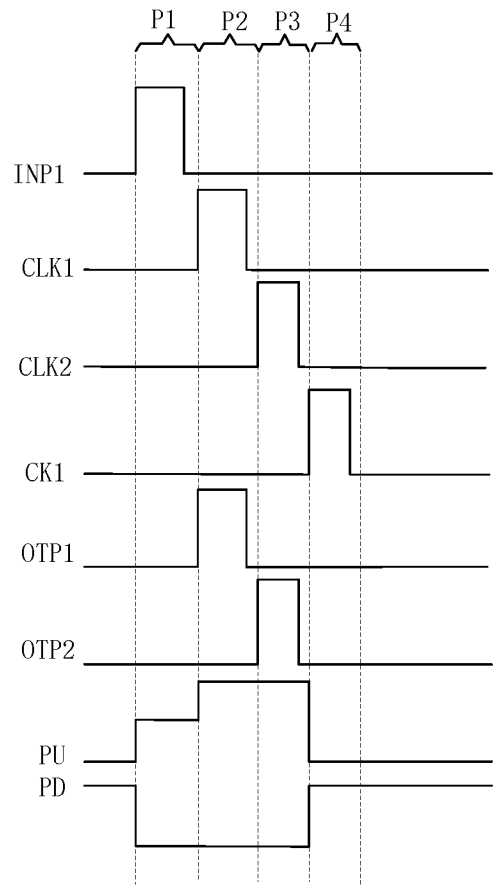
FIG. 3 is a timing diagram of signals for controlling the shift register shown in FIG. 2.

In the first period P1 shown in FIG. 3:

The first input sub-circuit 10 outputs a voltage on the first control voltage terminal CN to the pull-up node PU under the control of the first signal input terminal INP1.

The second pull-down control sub-circuit 40 pulls down the voltage on the pull-down node PD to the first voltage terminal VGL under the control of the pull-up node PU. The output sub-circuits store the signal of the pull-up node PU, and output the clock signals from the output clock signal terminals CLK to the signal output terminals coupled to the output sub-circuits 20 under the control of the pull-up node PU. In addition, the first pull-down control sub-circuit 30 and the pull-down sub-circuit 50 are both in the off state.

In a case where the structures of the sub-circuits in the above shift register is shown in FIG. 2, and the transistors in the sub-circuits are all N-type transistors, FIG. 2 shows an example in which the shift register includes two output sub-circuits, i.e., the first output sub-circuit 21 and the second output sub-circuit 22. As shown in FIG. 3, in this input period P1, a low level is input via the first output clock signal terminal CLK1 and the second output clock signal terminal CLK2, a high level is input via the first signal input terminal INP1, and a low level is input via the first clock signal terminal CK1. In addition, the pull-up node PU is at a high level, the pull-down node PD is at a low level, and a low level is output from the signal output terminals.

On this basis, the on and off states of the transistors in the above sub-circuits in the input period P1 are as follows. Since a high level is input via the first signal input terminal INP1, the first transistor T1 is turned on, and the high level from the first control voltage terminal CN is transmitted to the pull-up node PU, and is stored in the first voltage stabilizing capacitor CC1 and the second voltage stabilizing capacitor CC2. The first output transistor M1 and the second output transistor M2 are turned on under the control of the pull-up node PU, the low level from the first output clock signal terminal CLK1 is transmitted to the first signal output terminal OTP1 through the first output transistor M1, and the low level from the second output clock signal terminal CLK2 is transmitted to the second signal output terminal OTP2 through the second output transistor M2. In addition, the third transistor T3 is turned on under the control of the pull-up node PU, to pull down the potential at the pull-down node PD to the first voltage terminal VGL. Since the potential at the pull-down node PD is at a low level, the fourth transistor T4 is in the off state.

In addition, since a low level is input via the first clock signal terminal CK1, the second transistor T2 is in the off state.

In the Output Period:

The output sub-circuits 20 output the signal stored in the previous period to the pull-up node PU, and output the signals from the output clock signal terminals to the signal output terminals coupled to the output sub-circuits 20 in sequence under the control of the pull-up node PU. The gate scanning signals are output from the signal output terminals in sequence. In addition, in this period, the first pull-down control sub-circuit 30 and the pull-down sub-circuit 50 are both in the off state, and no signals are output from the first input sub-circuit 10.

In a case where the structures of the sub-circuits in the above shift register are shown in FIG. 2, and the transistors in the sub-circuits are all N-type transistors, FIG. 2 shows an example in which the shift register includes two output sub-circuits, i.e., the first output sub-circuit 21 and the second output sub-circuit 22. As shown in FIG. 3, the above output period includes a second period P2 and a third period P3.

In this case, in the second period P2 shown in FIG. 3, a high level is input via the first output clock signal terminal CLK1, a low level is input via the second output clock signal terminal CLK2, a low level is input via the first signal input terminal INP1, and a low level is input via the first clock signal terminal CK1. In addition, the pull-up node PU is at a high level, the pull-down node PD is at a low level, a high level is output from the first signal output terminal OTP1, and a low level is output from the second signal output terminal OTP2.

In the third period shown in FIG. 3, a low level is input via the first output clock signal terminal CLK1, a high level is input via the second output clock signal terminal CLK2, a low level is input via the first signal input terminal INP1, and a low level is input via the first clock signal terminal CK1. In addition, the pull-up node PU is at a high level, the pull-down node PD is at a low level, a low level is output from the first signal output terminal OTP1 to reset the first signal output terminal OTP1, and a high level is output from the second signal output terminal.

On this basis, the on and off states of the transistors in the above sub-circuits in the second period P2 are as follows. Since a low level is input via the first signal input terminal INP1, the first transistor T1 is in the off state. The first voltage stabilizing capacitor CC1 and the second voltage stabilizing capacitor CC2 charge the pull-up node PU with the high level stored in the first period P1, so that the first output transistor M1 and the second output transistor M2 are maintained in the on state. In this case, the high level from the first output clock signal terminal CLK1 is transmitted to the first signal output terminal OTP1 through the first output transistor M1, and the low level from the second output clock signal terminal CLK2 is transmitted to the second signal output terminal OTP2 through the second output transistor M2.

In addition, under the bootstrap action of the first voltage stabilizing capacitor CC1 and the second voltage stabilizing capacitor CC2, the potential at the pull-up node PU is further increased, to maintain the first output transistor M1 and the second output transistor M2 in the on state, so that the high level from the first output clock signal terminal CLK1 can be output to the gate line coupled to the first signal output terminal OTP1 as a gate scanning signal. In addition, similarly to the first period P1, the third transistor T3 is in the on state, and the second transistor T2 and the fourth transistor T4 are in the off state.

The on and off states of the transistors in the sub-circuits described above in the third period P3 are as follows. Since a low level is input via the first signal input terminal INP1, the first transistor T1 is in an off state. The first voltage stabilizing capacitor CC1 and the second voltage stabilizing capacitor CC2 charge the pull-up node PU with the high level stored in the first period P1, so that the first output transistor M1 and the second output transistor M2 are maintained in an on state. In this case, the low level of the first output clock signal terminal CLK1 is output to the first signal output terminal OTP1 through the first output transistor M1 to reset the first signal output terminal OTP1, and the high level of the second output clock signal terminal CLK2 is transmitted to the second signal output terminal OTP2 through the second output transistor M2, so as to output the gate scanning signal to the gate line coupled to the second signal output terminal OTP2.

In addition, under the bootstrap action of the first voltage stabilizing capacitor CC1 and the second voltage stabilizing capacitor CC2, the potential at the pull-up node PU is maintained at a high level to maintain the first output transistor M1 and the second output transistor M2 in an on state, so that the high level from the second output clock signal terminal CLK2 can be output to the gate line coupled to the second signal output terminal OTP2 as a continuous gate scanning signal. In addition, similarly to the first period P1, the third transistor T3 is in an on state, and the second transistor T2 and the fourth transistor T4 are in an off state.

In the reset period, i.e. the fourth period P4 shown in FIG. 3:

The first pull-down control sub-circuit 30 outputs the voltage on the first control voltage terminal CN to the pull-down node PD under the control of the first clock signal terminal CK1. The pull-down sub-circuit 50 pulls down the voltage on the pull-up node PU to the first voltage terminal VGL under the control of the pull-down node PD. In addition, in the fourth period P4, no signals are output from the first input sub-circuit 10, and no signals are output from the signal output terminals.

In the case where the structures of the sub-circuits in the above shift register are shown in FIG. 2, and the transistors in the sub-circuits are all N-type transistors, as shown in FIG. 3, in the fourth period P4, a low level is input via the first output clock signal terminal CLK1, a low level is input via the second output clock signal terminal CLK2, a high level is input via the first clock signal terminal CK1, and a low level is input via the first signal input terminal INP1. In addition, the pull-up node PU is at a low level, the pull-down node PD is at a high level, a low level is output from the first signal output terminal OTP1, and a low level is output from the second signal output terminal OTP2.

On this basis, the on and off states of the transistors in the sub-circuits described above in the fourth period P4 are as follows. Since a high level is input via the first clock signal terminal CK1, the second transistor T2 is turned on, and the high level from the first control voltage terminal CN is output to the pull-down node PD via the second transistor T2. The fourth transistor T4 is turned on under the control of the pull-down node PD, and the potential at the pull-up node PU is pulled down to the first voltage terminal VGL through the fourth transistor T4, to reset the pull-up node PU. The third transistor T3, the first output transistor M1 and the second output transistor M2 are in the off state under the control of the pull-up node PU, so that no gate scanning signals are output from the first signal output terminal OTP1 and the second signal output terminal OTP2, thereby resetting the signal output terminals.

Next, the fourth period P4 is repeated before the next image frame, so as to maintain the potential at the pull-down node PD at a high level, and to pull down the potential at the pull-up node PU under the control of the pull-down node PD to enable the output transistors M in the off state.

On this basis, within one image frame, the potential at the pull-up node PU may be controlled by the first input sub-circuit 10, and the pull-up node PU may control the output sub-circuits 20 to sequentially output the clock signals from the output clock signal terminals CLK to the signal output terminals, so that in the output period, gate scanning signals may be output from the signal output terminals to the gate lines coupled thereto respectively.

In addition, the first pull-down control sub-circuit 30 and the second pull-down control sub-circuit 40 can control the potential at the pull-down node PD, to pull down the potential at the pull-down node PD to the potential at the first voltage terminal VGL, or to pull up the potential at the pull-down node PD, so that the pull-down node PD can control the pull-down sub-circuit 50 to pull down the potential at the pull-up node PU to the potential at the first voltage terminal VGL.

In addition, in one shift register, when the clock signal from one output clock signal terminal such as CLK1 of the shift register is at a high level, the first output sub-circuit receiving the signal from the output clock signal terminal CLK1 outputs a gate scanning signal via the signal output terminal OTP1 coupled to the first output sub-circuit. In this case, the clock signal from other output clock signal terminals such as CLK2, . . . , CLKn are at a low level, so that no gate scanning signals are output from the signal output terminal OTP2 coupled to the second output sub-circuit, . . . , the signal output terminal OTPn coupled to the n-th output sub-circuit, therefore the gate scanning signals may output from signal output terminals to the gate lines coupled thereto in sequence.

In this way, since the shift register provided by some embodiments of the present disclosure has a plurality of signal output terminals, one shift register may output multistage gate scanning signals. In this case, one shift register does not need to output the gate scanning signals to only one gate line, which may reduce the layout area of the GOA circuit on the display panel, thereby achieving a narrower bezel.

The foregoing descriptions are merely specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A shift register, comprising a first input sub-circuit, a first pull-down control sub-circuit, a second pull-down control sub-circuit, a pull-down sub-circuit and n output sub-circuits, wherein n is greater than or equal to 2, and n is a positive integer;
   the first input sub-circuit is coupled to a first signal input terminal, a first control voltage terminal and a pull-up node, and the first input sub-circuit is configured to output a voltage on the first control voltage terminal to the pull-up node under control of the first signal input terminal;
   each output sub-circuit is coupled to the pull-up node, a signal output terminal and an output clock signal terminal, and the output sub-circuit is configured to output a signal from the output clock signal terminal to the signal output terminal under control of the pull-up node;
   the first pull-down control sub-circuit is coupled to the first control voltage terminal, a first clock signal terminal and a pull-down node, and the first pull-down control sub-circuit is configured to output a voltage on the first control voltage terminal to the pull-down node under control of the first clock signal terminal;
   the second pull-down control sub-circuit is coupled to the pull-up node, the pull-down node and a first voltage terminal, and the second pull-down control sub-circuit is configured to pull down a voltage on the pull-down node to a first voltage under control of the pull-up node;
   the pull-down sub-circuit is coupled to the pull-up node, the pull-down node and the first voltage terminal, and the pull-down sub-circuit is configured to pull down a voltage on the pull-up node to the first voltage under control of the pull-down node.

2. The shift register according to claim 1, wherein the first input sub-circuit includes a first transistor;
   a gate of the first transistor is coupled to the first signal input terminal, a first electrode of the first transistor is coupled to the first control voltage terminal, and a second electrode of the first transistor is coupled to the pull-up node.

3. The shift register according to claim 1, wherein each output sub-circuit includes an output transistor and a voltage stabilizing capacitor;
   a gate of the output transistor is coupled to the pull-up node, a first electrode of the output transistor is coupled to the output clock signal terminal, and a second electrode of the output transistor is coupled to the signal output terminal;
   one end of the voltage stabilizing capacitor is coupled to the pull-up node, and another end of the voltage stabilizing capacitor is coupled to the output signal output terminal.

4. The shift register according to claim 1, wherein the first pull-down control sub-circuit includes a second transistor; a gate of the second transistor is coupled to the first clock signal terminal, a first electrode of the second transistor is coupled to the first control voltage terminal, and a second electrode of the second transistor is coupled to the pull-down node;
   the second pull-down control sub-circuit includes a third transistor; a gate of the third transistor is coupled to the pull-up node, a first electrode of the third transistor is coupled to the pull-down node, and a second electrode of the third transistor is coupled to the first voltage terminal;

the pull-down sub-circuit includes a fourth transistor; a gate of the fourth transistor is coupled to the pull-down node, a first electrode of the fourth transistor is coupled to the pull-up node, and a second electrode of the fourth transistor is coupled to the first voltage terminal.

5. The shift register according to claim 1, wherein the pull-down sub-circuit is further coupled to the signal output terminal, and the pull-down sub-circuit is further configured to pull down a potential at the signal output terminal to the first voltage terminal under control of the pull-down node;
the pull-down sub-circuit further includes a plurality of output pull-down transistors;
a gate of each output pull-down transistor is coupled to the pull-down node, a first electrode of the output pull-down transistor is coupled to a signal output terminal, and a second electrode of the output pull-down transistor is coupled to the first voltage terminal.

6. The shift register according to claim 1, wherein the shift register further comprises a first voltage-regulator and noise-reduction sub-circuit coupled between the first input sub-circuit and the pull-up node, and the first voltage-regulator and noise-reduction sub-circuit is further coupled to the first voltage terminal and/or a second voltage terminal;
the first voltage-regulator and noise-reduction sub-circuit is configured to stabilize a voltage on the pull-up node and reduce noise of the voltage on the pull-up note under control of the first voltage terminal and/or the second voltage terminal.

7. The shift register according to claim 6, wherein the first voltage-regulator and noise-reduction sub-circuit includes a first capacitor and/or a fifth transistor;
one end of the first capacitor is coupled to an output terminal of the first input sub-circuit, and another end of the first capacitor is coupled to the first voltage terminal;
a gate of the fifth transistor is coupled to the second voltage terminal, a first electrode of the fifth transistor is coupled to the output terminal of the first input sub-circuit, and a second electrode of the fifth transistor is coupled to the pull-up node.

8. The shift register according to claim 1, wherein the shift register further comprises a second voltage-regulator and noise-reduction sub-circuit coupled between the first pull-down control sub-circuit and the pull-down node, and the second voltage-regulator and noise-reduction sub-circuit is also coupled to the first voltage terminal and/or the second voltage terminal;
the second voltage-regulator and noise-reduction sub-circuit is configured to stabilize a voltage on the pull-down node and reduce noise of the voltage on the pull-down node under control of the first voltage terminal and/or the second voltage terminal.

9. The shift register according to claim 8, wherein the second voltage-regulator and noise-reduction sub-circuit includes a second capacitor and/or a sixth transistor;
one end of the second capacitor is electrically connected to an output terminal of the first pull-down control sub-circuit, and another end of the second capacitor is coupled to the first voltage terminal;
a gate of the sixth transistor is coupled to the second voltage terminal, a first electrode of the sixth transistor is coupled to the output terminal of the first pull-down control sub-circuit, and a second electrode of the sixth transistor is coupled to the pull-down node.

10. The shift register according to claim 1, wherein the shift register further comprises a second input sub-circuit;

the second input sub-circuit is coupled to a second signal input terminal, a second control voltage terminal, and the pull-up node, and the first second input sub-circuit is configured to output a voltage on the second control voltage terminal to the pull-up node under control of the second signal input terminal.

11. The shift register according to claim 10, wherein the second input sub-circuit includes an eighth transistor;
a gate of the eighth transistor is coupled to the second signal input terminal, a first electrode of the eighth transistor is coupled to the second control voltage terminal, and a second electrode of the eighth transistor is coupled to the pull-up node.

12. A gate driving circuit, comprising a plurality of cascaded shift registers according to claim 10, wherein
a first signal input terminal of a first-stage shift register is coupled to an initial signal terminal;
except for the first-stage shift register, a first signal input terminal of each stage of the shift registers is coupled to a last signal output terminal of a shift register in a previous stage of the shift register in this stage;
except for a last stage shift register, a second signal input terminal of each stage of the shift registers is coupled to a first signal output terminal of a shift register in a next stage of the shift register in this stage;
a second signal input terminal of the last stage shift register is coupled to the initial signal terminal.

13. A display device, comprising the gate driving circuit according to claim 12.

14. A gate driving circuit, comprising a plurality of cascaded shift registers according to claim 1, wherein
a first signal input terminal of a first-stage shift register is coupled to an initial signal terminal;
except for the first-stage shift register, a first signal input terminal of each stage of the shift registers is coupled to a last signal output terminal of a shift register in a previous stage of the shift register in this stage.

15. A display device, comprising the gate driving circuit according to claim 14.

16. The shift register according to claim 1, wherein the shift register further comprises a third pull-down control sub-circuit;
the third pull-down control sub-circuit is coupled to a second control voltage terminal, a second clock signal terminal, and the pull-down node, and the third pull-down control sub-circuit is configured to output a voltage on the second control voltage terminal to the pull-down node under control of the second clock signal terminal.

17. The shift register according to claim 16, wherein the third pull-down control sub-circuit includes a ninth transistor;
a gate of the ninth transistor is coupled to the second clock signal terminal, a first electrode of the ninth transistor is coupled to the second control voltage terminal, and a second electrode of the ninth transistor is coupled to the pull-down node.

18. A method of driving the shift register according to claim 1, wherein within one image frame, the method comprises:
in a charging period, outputting, by the first input sub-circuit, a voltage on the first control voltage terminal to the pull-up node under the control of the first signal input terminal, and pulling down, by the second pull-down control sub-circuit, a voltage on the pull-down node to the first voltage terminal under the control of the pull-up node;

storing, by each output sub-circuit, a signal at the pull-up node, and outputting, by the output sub-circuit, a signal input via each output clock signal terminal to a signal output terminal coupled to the output sub-circuit under the control of the pull-up node;

in an output period, outputting, by each output sub-circuit, a signal stored in the previous period to the pull-up node, and outputting, by output sub-circuits, signals from output clock signal terminals to signal output terminals coupled to the output sub-circuits in sequence under the control of the pull-up node, so that gate scanning signals are output from the signal output terminals in sequence; and in a reset period, outputting, by the first pull-down control sub-circuit, a voltage on the first control voltage terminal to the pull-down node under the control of the first clock signal terminal;

pulling down, by the pull-down sub-circuit, a voltage on the pull-up node to the first voltage terminal under the control of the pull-down node.

* * * * *